(12) United States Patent
Tahara et al.

(10) Patent No.: US 12,700,838 B2
(45) Date of Patent: Aug. 4, 2026

(54) RADIO FREQUENCY CIRCUIT AND COMMUNICATION DEVICE

(71) Applicant: Murata Manufacturing Co., Ltd., Nagaokakyo (JP)

(72) Inventors: Kenji Tahara, Nagaokakyo (JP); Ryo Wakabayashi, Nagaokakyo (JP); Kae Yamamoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 333 days.

(21) Appl. No.: 18/589,440

(22) Filed: Feb. 28, 2024

(65) Prior Publication Data

US 2024/0204739 A1 Jun. 20, 2024

Related U.S. Application Data

(63) Continuation of application No. PCT/JP2022/036656, filed on Sep. 30, 2022.

(30) Foreign Application Priority Data

Oct. 28, 2021 (JP) ................................. 2021-176192

(51) Int. Cl.
*H03F 3/00* (2006.01)
*H03F 1/02* (2006.01)
*H03F 3/24* (2006.01)

(52) U.S. Cl.
CPC ........... *H03F 3/245* (2013.01); *H03F 1/0288* (2013.01); *H03F 2200/451* (2013.01)

(58) Field of Classification Search
CPC .. H03F 3/245; H03F 1/0288; H03F 2200/451; H03F 1/02; H03F 1/32; H03F 3/195; H03F 3/24; H03F 3/68; H03F 3/60
See application file for complete search history.

(56) References Cited

U.S. PATENT DOCUMENTS

2010/0194493 A1* 8/2010 Thompson ................ H01P 5/10
333/132
2018/0241362 A1* 8/2018 Takenaka .............. H03F 1/0288
(Continued)

FOREIGN PATENT DOCUMENTS

JP 2018-074320 A 5/2018
JP 2018-137566 A 8/2018
(Continued)

OTHER PUBLICATIONS

International Search Report and Written Opinion mailed on Dec. 27, 2022, received for PCT Application No. PCT/JP2022/036656, filed on Sep. 30, 2022, 09 pages including English Translation.

*Primary Examiner* — Ping Y Hsieh

(74) *Attorney, Agent, or Firm* — XSENSUS LLP

(57) ABSTRACT

A radio frequency circuit includes a carrier amplifier, a peaking amplifier, an input-side coil, an output-side coil, harmonic reduction circuits, and a phase shift line. One end of the input-side coil is connected to the carrier amplifier, and the other end thereof is connected to the peaking amplifier. In the harmonic reduction circuit, an inductor and a capacitor that are connected in series are disposed in series on a path connecting the carrier amplifier and the ground. The harmonic reduction circuit has an inductor and a capacitor that are connected in series and an inductor connected in parallel to the capacitor. The inductor and the capacitor are disposed in series on a path connecting the peaking amplifier and the ground.

20 Claims, 8 Drawing Sheets

(56)     References Cited

U.S. PATENT DOCUMENTS

| | | | | |
|---|---|---|---|---|
| 2021/0111743 A1* | 4/2021 | Tsuchida | .................. | H04B 1/04 |
| 2021/0152130 A1* | 5/2021 | Srinidhi Embar | .... | H03F 1/0288 |
| 2021/0211107 A1* | 7/2021 | Liu | .......................... | H04B 1/40 |

FOREIGN PATENT DOCUMENTS

| | | |
|---|---|---|
| JP | 2021-061577 A | 4/2021 |
| JP | 2021-103851 A | 7/2021 |

* cited by examiner

RADIO FREQUENCY CIRCUIT AND COMMUNICATION DEVICE

CROSS-REFERENCE TO RELATED APPLICATIONS

This is a continuation application of PCT/JP2022/036656, filed on Sep. 30, 2022, designating the United States of America, which is based on and claims priority to Japanese Patent Application No. JP 2021-176192 filed on Oct. 28, 2021. The entire contents of the above-identified applications, including the specifications, drawings and claims, are incorporated herein by reference in their entirety.

TECHNICAL FIELD

The present disclosure relates to a radio frequency circuit and a communication device.

BACKGROUND ART

Patent Document 1 discloses a power amplifier circuit including a first amplifier (carrier amplifier), a first transformer, a second amplifier (peaking amplifier), and a second transformer. In an area where the power level of an input signal is higher than or equal to a first level, the first amplifier amplifies a first signal split from the input signal and outputs a second signal. The second signal is input to the first transformer. In an area where the power level of the input signal is higher than or equal to a second level that is higher than the first level, the second amplifier amplifies a third signal split from the input signal and outputs a fourth signal. The fourth signal is input to the second transformer.

CITATION LIST

Patent Document

Patent Document 1: Japanese Unexamined Patent Application Publication No. 2018-137566

SUMMARY OF DISCLOSURE

Technical Problem

In the power amplifier circuit disclosed in Patent Document 1, means for reducing a high-order harmonic wave is required to improve the linearity of a high output radio frequency signal from the first amplifier and the second amplifier.

However, if the high-order harmonic wave reduction at the time of both of operation and non-operation of the first amplifier and the second amplifier is intended, the transmission characteristics of a fundamental wave are deteriorated on occasions.

The present disclosure has been made to address the issue mentioned above and aims to provide a radio frequency circuit and a communication device that have a plurality of amplification devices and transformers and that are capable of harmonic wave reduction without deteriorating the transmission characteristic of the fundamental wave.

Solution to Problem

To achieve the object above, a radio frequency circuit according to an aspect of the present disclosure includes: a first amplification device and a second amplification device;

a transformer having an input-side coil and an output-side coil; a signal output terminal to which an end of the output-side coil is connected; a first circuit and a second circuit; and a phase shift line. An end of the input-side coil is connected to an output terminal of the first amplification device, and another end of the input-side coil is connected to an output terminal of the second amplification device. Another end of the output-side coil is connected to ground. The phase shift line is connected between the output terminal of the first amplification device and the end of the input-side coil or between the output terminal of the second amplification device and the other end of the input-side coil. The first circuit has a first inductor and a first capacitor that are connected in series to each other. The first inductor and the first capacitor are disposed in series on a path connecting the ground and a point on a path connecting an output terminal of the first amplification device and an end of the input-side coil. The second circuit has a second inductor, a second capacitor, and a third inductor, the second inductor and the second capacitor being connected in series to each other, the third inductor being connected in parallel to the second capacitor. The second inductor and the second capacitor are disposed in series on a path connecting the ground and a point on a path connecting the output terminal of the second amplification device and the other end of the input-side coil.

A radio frequency circuit according to an aspect of the present disclosure includes: a first amplification device and a second amplification device; a first transformer having a first input-side coil and a first output-side coil; a second transformer having a second input-side coil and a second output-side coil; a signal output terminal to which an end of the first output-side coil is connected; a first circuit and a second circuit; and a phase shift line. An end of the first input-side coil is connected to an output terminal of the first amplification device, another end of the first input-side coil is connected to ground, an end of the second input-side coil is connected to an output terminal of the second amplification device, and another end of the second input-side coil is connected to the ground. Another end of the first output-side coil is connected to an end of the second output-side coil, and another end of the second output-side coil is connected to the ground. The phase shift line is connected between the output terminal of the first amplification device and the end of the first input-side coil or between the output terminal of the second amplification device and the end of the second input-side coil. The first circuit has a first inductor and a first capacitor that are connected in series to each other. The first inductor and the first capacitor are disposed in series on a path connecting the ground and a point on a path connecting the output terminal of the first amplification device and the end of the first input-side coil. The second circuit has a second inductor, a second capacitor, and a third inductor, the second inductor and the second capacitor being connected in series to each other, the third inductor being connected in parallel to the second capacitor. The second inductor and the second capacitor are disposed in series on a path connecting the ground and a point on a path connecting the output terminal of the second amplification device and the end of the second input-side coil.

A radio frequency circuit according to an aspect of the present disclosure includes: a first amplification device, a second amplification device, a third amplification device, and a fourth amplification device; a first transformer having a first input-side coil and a first output-side coil; a second transformer having a second input-side coil and a second output-side coil; a signal output terminal to which an end of the first output-side coil is connected; a first circuit, a second circuit, a third circuit, and a fourth circuit; and a first phase shift line and a second phase shift line. An end of the first input-side coil is connected to an output terminal of the first amplification device, another end of the first input-side coil is connected to an output terminal of the third amplification device, an end of the second input-side coil is connected to an output terminal of the second amplification device, and another end of the second input-side coil is connected to an output terminal of the fourth amplification device. Another end of the first output-side coil is connected to an end of the second output-side coil, and another end of the second output-side coil is connected to ground. The first phase shift line is connected between the output terminal of the first amplification device and the end of the first input-side coil, and the second phase shift line is connected between the output terminal of the third amplification device and the other end of the first input-side coil, or the first phase shift line is connected between the output terminal of the second amplification device and the end of the second input-side coil, and the second phase shift line is connected between the output terminal of the fourth amplification device and the other end of the second input-side coil. The first circuit has a first inductor and a first capacitor that are connected in series to each other. The first inductor and the first capacitor are disposed in series on a path connecting the ground and a point on a path connecting the output terminal of the first amplification device and the end of the first input-side coil. The second circuit has a second inductor, a second capacitor, and a third inductor, the second inductor and the second capacitor being connected in series to each other, the third inductor being connected in parallel to the second capacitor. The second inductor and the second capacitor are disposed in series on a path connecting the ground and a point on a path connecting the output terminal of the second amplification device and the end of the second input-side coil. The third circuit has a fourth inductor and a third capacitor that are connected in series to each other. The fourth inductor and the third capacitor are disposed in series on a path connecting the ground and a point on a path connecting the output terminal of the third amplification device and the other end of the first input-side coil. The fourth circuit has a fifth inductor, a fourth capacitor, and a sixth inductor, the fifth inductor and the fourth capacitor being connected in series to each other, the sixth inductor being connected in parallel to the fourth capacitor. The fifth inductor and the fourth capacitor are disposed in series on a path connecting the ground and a point on a path connecting the output terminal of the fourth amplification device and the other end of the second input-side coil.

Effects of Disclosure

According to the present disclosure, a radio frequency circuit and a communication device that have a plurality of amplification devices and transformers and that are capable of harmonic wave reduction without deteriorating the transmission characteristic of the fundamental wave may be provided.

DESCRIPTION OF EMBODIMENTS

Figure 1:
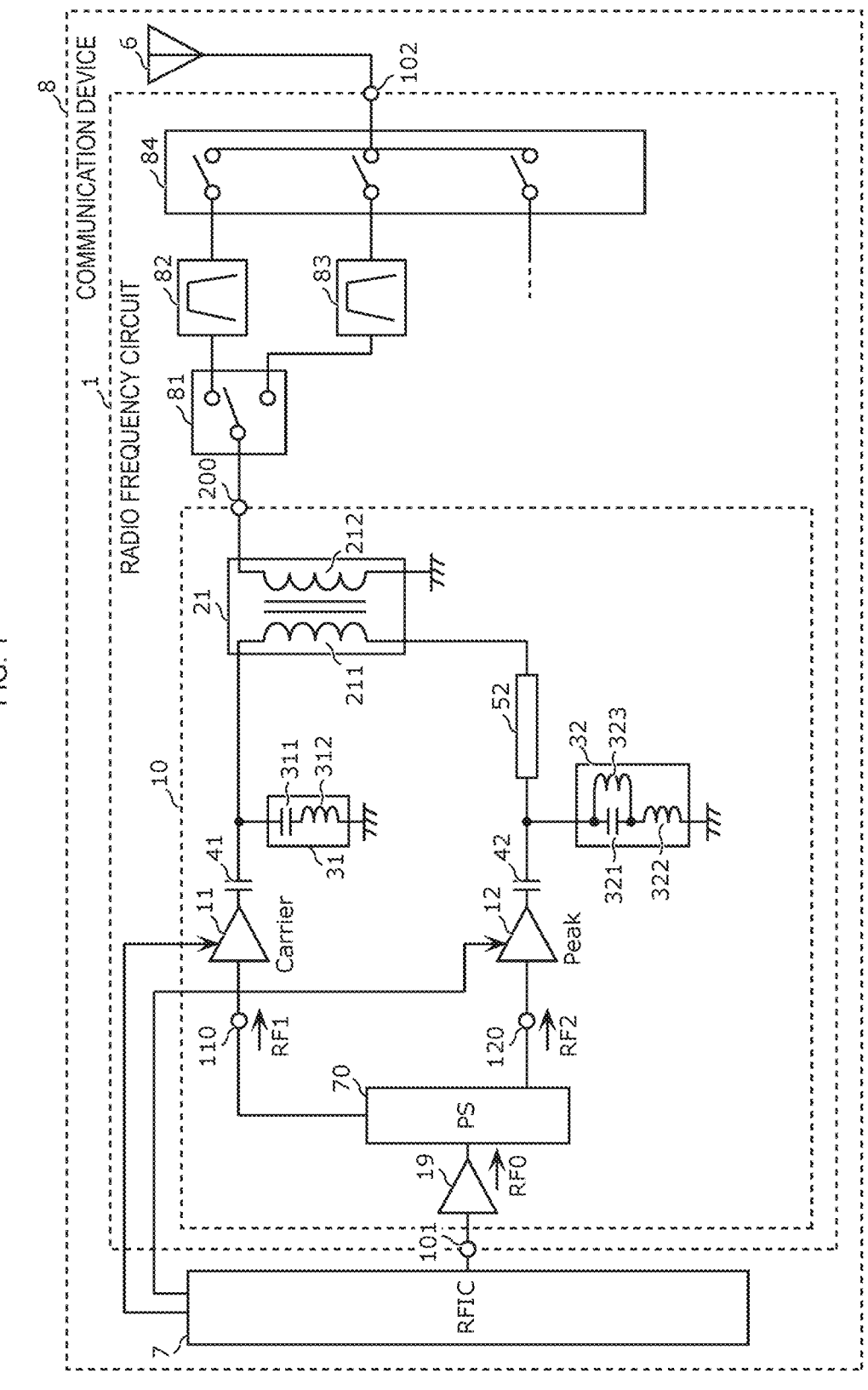
FIG. 1 is a circuit configuration diagram of a radio frequency circuit and a communication device according to an embodiment.

Hereinafter, an embodiment of the present disclosure will be described in detail by using the drawings. The embodiment to be described later represents a comprehensive or specific example. A numerical value, a shape, a material, a component, the disposition of the component, and the like described in the following embodiment are an example and are not intended to limit the present disclosure.

Each drawing is a schematic view appropriately subjected to emphasis, omission, or ratio control to describe the present disclosure, is not necessarily strictly illustrated, and has a shape, a positional relationship and a ratio different from actual ones on occasions. Substantially the same components are denoted by the same reference numerals throughout the drawings, and redundancy is omitted or simplified in some cases.

In the present disclosure, the term "connected" includes not only a case of being directly connected by using a connection terminal and/or a wiring conductor but also a case of being electrically connected with a different circuit element interposed therebetween. The phrase "connected between A and B" denotes being connected to A and B on a path connecting A and B.

In the present disclosure, the terms "signal path" and "path" denote a transmission line composed of wiring through which a radio frequency signal propagates, an electrode directly connected to the wiring, a terminal directly connected to the wiring or the electrode, or the like.

In the configuration in the present disclosure, the term "in a plan view" denotes viewing an object orthographically projected from the positive side of a z axis onto an xy plane. The phrase "a component is disposed on a main surface of the substrate" denotes not only that a component is disposed on the main surface of the substrate in contact with the main surface but also that a component is disposed above the main surface not in contact with the main surface, the component is disposed with part of the component being embedded in the substrate from the main surface side.

In the configuration in the present disclosure, the phrase "a component A is disposed in series to a path B" denotes that both of the signal input terminal and the signal output terminal of the component A are connected to a wiring line, an electrode, or a terminal included in the path B.

EMBODIMENT

[1. Circuit Configuration of Radio Frequency Circuit 1 and Communication Device 8]

The circuit configuration of a radio frequency circuit 1 and a communication device 8 according to this embodiment will be described with reference to FIG. 1. FIG. 1 is a circuit configuration diagram of the radio frequency circuit 1 and the communication device 8 according to the embodiment.

[1.1 Circuit Configuration of Communication Device 8]

First, the circuit configuration of the communication device 8 will be described. As illustrated in FIG. 1, the communication device 8 according to this embodiment includes the radio frequency circuit 1, an antenna 6, and a RF signal processing circuit (RFIC) 7.

The radio frequency circuit 1 transmits a radio frequency signal between the antenna 6 and the RFIC 7. The detailed circuit configuration of the radio frequency circuit 1 will be described later.

The antenna 6 is connected to an antenna connection terminal 102 of the radio frequency circuit 1, transmits a radio frequency signal output from the radio frequency circuit 1, receives a radio frequency signal from the outside, and outputs the radio frequency signal to the radio frequency circuit 1.

The RFIC 7 is an example of a signal processing circuit that processes a radio frequency signal. Specifically, the RFIC 7 performs signal processing by down converting or the like on a reception signal input via the reception path of the radio frequency circuit 1. A reception signal generated by the signal processing to a baseband signal processing circuit (BBIC, not illustrated). The RFIC 7 performs signal processing by upconverting or the like on a transmission signal input from the BBIC and outputs a transmission signal generated by the signal processing to a transmission path of the radio frequency circuit 1. The RFIC 7 has a control unit that controls switches, amplification devices, and other components of the radio frequency circuit 1. Part of entirety of the function of the control unit of the RFIC 7 may be implemented by a device outside of the RFIC 7, for example, by the BBIC or the radio frequency circuit 1.

The RFIC 7 also has a function serving as a control unit that controls a supply voltage Vcc and a bias voltage Vbias supplied to amplifiers of the radio frequency circuit 1. Specifically, the RFIC 7 outputs a digital control signal to the radio frequency circuit 1. The amplifiers of the radio frequency circuit 1 are supplied with the supply voltage Vcc and the bias voltage Vbias controlled by the aforementioned digital control signal.

The RFIC 7 also has a function as a control unit that controls the connection of switches 81 and 84 of the radio frequency circuit 1 based on a used communication band (frequency band).

In the communication device 8 according to this embodiment, the antenna 6 is an optional component.

[1.2 Circuit Configuration of Radio Frequency Circuit 1]

The circuit configuration of the radio frequency circuit 1 will then be described. As illustrated in FIG. 1, the radio frequency circuit 1 includes an amplifier circuit 10, filters 82 and 83, the switches 81 and 84, an input terminal 101, and the antenna connection terminal 102.

The input terminal 101 is connected to the RFIC 7, and the antenna connection terminal 102 is connected to the antenna 6.

The amplifier circuit 10 is a Doherty amplifier circuit that amplifies a transmission signal in Band A and Band B input from the input terminal 101. The radio frequency circuit 1 may include a Doherty first amplifier circuit that amplifies a radio frequency signal in Band A and a Doherty second amplifier circuit that amplifies a radio frequency signal in Band B, instead of the amplifier circuit 10.

In this embodiment, for a communication system built up by using radio access technology (RAT), each of Band A and Band B denotes a frequency band defined in advance by a standardization organization or the like (such as 3rd Generation Partnership Project (3GPP) (registered trademark) or Institute of Electrical and Electronics Engineers (IEEE)). In this embodiment, as the communication system, for example, a 4th Generation (4G)—Long Term Evolution (LTE) system, a 5th generation (5G)—new radio (NR) system, or a wireless local area network (WLAN) system may be used, but the communication system is not limited to these.

The filter 82 is connected between the switches 81 and 84 and allows, to pass, transmission signals in the Band A transmission band of transmission signals amplified by the amplifier circuit 10. The filter 83 is connected between the switches 81 and 84 and allows, to pass, transmission signals in the band B transmission band of the transmission signals amplified by the amplifier circuit 10.

Each of the filters 82 and 83 may form a filter for reception and a duplexer and may also be a filter that performs transmission by time division duplex (TDD). Assuming the filters 82 and 83 are a filter for the TDD, a switch that performs switching between transmission and reception is disposed at least one of prior or subsequent to the filter.

The switch 81 has a common terminal, a first selection terminal, and a second selection terminal. The common terminal is connected to a signal output terminal 200 of the amplifier circuit 10. The first selection terminal is connected to the filter 82, and the second selection terminal is connected to the filter 83. In this connection configuration, the switch 81 performs switching between connection between the amplifier circuit 10 and the filter 82 and between connection between the amplifier circuit 10 and the filter 83.

The switch 84 is an example of an antenna switch. The switch 84 is connected to the antenna connection terminal 102, performs switching between connection and non-connection between the antenna connection terminal 102 and the filter 82, and performs switching between connection and non-connection between the antenna connection terminal 102 and the filter 83.

The radio frequency circuit 1 may also include a reception circuit for transmitting, to the RFIC 7, a reception signal received from the antenna 6. In this case, the radio frequency circuit 1 includes a low noise amplifier and a filter for reception.

An impedance matching circuit may be disposed in a portion from the signal output terminal 200 to the antenna connection terminal 102.

According to the circuit configuration mentioned above, the radio frequency circuit 1 may transmit or receive a radio frequency signal in either Band A or Band B. Further, the radio frequency circuit 1 performs at least one of simultaneous transmission, simultaneous reception, or simultaneous transmission and reception on a radio frequency signal in Band A and Band B.

It suffices that the radio frequency circuit 1 according to the present disclosure includes at least the amplifier circuit 10 in the circuit configuration illustrated in FIG. 1.

The circuit configuration of the amplifier circuit 10 will be described in detail.

As illustrated in FIG. 1, the amplifier circuit 10 includes a carrier amplifier 11, a peaking amplifier 12, a preamplifier 19, a phase shift circuit 70, a transformer 21, harmonic reduction circuits 31 and 32, a phase shift line 52, capacitors 41 and 42, and the signal output terminal 200.

The preamplifier 19 amplifies input from the input terminal 101 a radio frequency signal in Band A and/or Band B.

The phase shift circuit 70 splits a signal RF0 output from the preamplifier 19 and outputs signals RF1 and RF2 resulting from the splitting to the carrier amplifier 11 and the peaking amplifier 12 via terminals 110 and 120. The phase shift circuit 70 adjusts the phase of the signal RF1 and RF2 at this time. For example, the phase shift circuit 70 shifts the signal RF1 by +90 degrees with respect to the RF0 (advances the signal RF1 by 90 degrees) and shifts the signal RF2 by zero degrees with respect to the RF0 (phase-shifted).

The configurations of the preamplifier 19 and the phase shift circuit 70 are not limited to the configurations above. For example, the preamplifier 19 may be disposed prior to each of the carrier amplifier 11 and the peaking amplifier 12. In this case, the phase shift circuit 70 may be disposed prior to the preamplifiers or prior to each of the carrier amplifier 11 and the peaking amplifier 12. The preamplifier 19 and the phase shift circuit 70 are optional components of the amplifier circuit 10.

Each of the carrier amplifier 11 and the peaking amplifier 12 as an amplifying transistor. The amplifying transistor above is, for example, a bipolar transistor such as a hetero-junction bipolar transistor (HBT) or a field effect transistor such as a metal-oxide-semiconductor field effect transistor (MOSFET).

The carrier amplifier 11 is an example of a first amplification device in this embodiment. The carrier amplifier 11 is a Class A (or Class AB) amplifier circuit capable of amplification operation, for example, for all power levels of the signal RF1 and capable of highly efficient amplification operation particularly in a low output area and a medium output area. The first amplification device according to this embodiment is only required to be a Class A (or Class AB) amplifier circuit and is not limited to a carrier amplifier.

The peaking amplifier 12 is an example of a second amplification device in this embodiment and is, for example, a Class C amplifier circuit capable of amplification operation in an area where the power level of the signal RF2 is high. A bias voltage lower than a bias voltage applied to the amplifying transistor of the carrier amplifier 11 is applied to the amplifying transistor of the peaking amplifier 12. Accordingly, the higher the power level of the signal RF2, the lower output impedance. This enables the peaking amplifier 12 to perform the amplification operation with low distortion in the high output area. The second amplification device according to this embodiment is only required to be a Class C amplifier circuit and not limited to a peaking amplifier.

The transformer 21 is an example of a transformer and has an input-side coil 211 and an output-side coil 212. One end of the input-side coil 211 is connected to an output terminal of the carrier amplifier 11 with the capacitor 41 interposed therebetween. The other end of the input-side coil 211 is connected to an output terminal of the peaking amplifier 12 with the capacitor 42 and the phase shift line 52 interposed therebetween. One end of the output-side coil 212 is connected to the signal output terminal 200, and the other end of the output-side coil 212 is connected to the ground.

According to the connection configuration above of the transformer 21, a signal output from the carrier amplifier 11 and a signal output from the peaking amplifier 12 are voltage-summed, and a combined output signal is output from the signal output terminal 200.

The harmonic reduction circuit 31 is an example of a first circuit in this embodiment and has an inductor 312 (first inductor) and a capacitor 311 (first capacitor) that are connected in series to each other. The inductor 312 and the capacitor 311 are disposed in series on a path connecting the output terminal of the carrier amplifier 11 and the ground. More specifically, in the harmonic reduction circuit 31, one end thereof is connected to a point on a path connecting the output terminal of the carrier amplifier 11 and one end of the input-side coil 211, and the other end thereof is connected to the ground. In this embodiment, of the inductor 312 and the capacitor 311, the inductor 312 is connected on the ground side, but the capacitor 311 may be connected on the ground side. The circuit configuration mentioned above causes the inductor 312 and the capacitor 311 to form a LC series resonant circuit, and the impedance thereof becomes minimum (a short circuit) at a LC series resonant frequency of the LC series resonant circuit. Assuming the LC series resonant frequency is set at a frequency of a second-order harmonic wave of a transmission signal input from the terminal 110, a second-order harmonic wave component of a transmission signal output from the carrier amplifier 11 may thereby be prevented from leaking to a portion closer to the transformer 21 than to the harmonic reduction circuit 31.

The harmonic reduction circuit 32 is an example of a second circuit in this embodiment and has an inductor 322 (second inductor) and a capacitor 321 (second capacitor) that are connected in series to each other and an inductor 323 (third inductor) connected in parallel to the capacitor 321. The inductor 322 and the capacitor 321 are disposed in series on a path connecting the output terminal of the peaking amplifier 12 and the ground. More specifically, in the harmonic reduction circuit 32, one end thereof is connected to a point on a path connecting the output terminal of the peaking amplifier 12 and the other end of the input-side coil 211, and the other end thereof is connected to the ground. In this embodiment, of the inductor 322 and the capacitor 321, the inductor 322 is connected on the ground side, but the capacitor 321 may be connected on the ground side. The circuit configuration mentioned above causes the inductor 322 and the capacitor 321 to form a LC series resonant circuit, and the impedance thereof becomes minimum (short circuit) at the LC series resonant frequency of the LC series resonant circuit. The LC series resonant frequency is set at the frequency of the second-order harmonic wave of a transmission signal input from the terminal 120, and thereby a second-order harmonic wave component of a transmission signal output from the peaking amplifier 12 may be prevented from leaking to a portion closer to the transformer 21 than to the harmonic reduction circuit 32.

The inductors 312, 322, and 323 may be a coil conductor formed on or in a chip component or a substrate and may also be composed of a wiring line such as a wire. The harmonic reduction circuit 31 and the harmonic reduction circuit 32 do not have the same circuit configuration. For example, the inductor 323 is connected in parallel to the capacitor 321 in the harmonic reduction circuit 32, while an inductor is not connected in parallel to the capacitor 311 in the harmonic reduction circuit 31.

The phase shift line 52 is an example of a delay line. The phase shift line 52 is, for example, a ¼ wavelength transmission line and delays the phase of a radio frequency signal input from one end by a ¼ wavelength and outputs the radio frequency signal from the other end. The one end of the phase shift line 52 is connected to the output terminal of the peaking amplifier 12 with the capacitor 42 interposed therebetween, and the other end of the phase shift line 52 is connected to the other end of the input-side coil 211.

The one end of the phase shift line 52 may be connected to the output terminal of the carrier amplifier 11 with the capacitor 41 interposed therebetween, and the other end of the phase shift line 52 may be connected to the one end of the input-side coil 211. That is, it suffices that the phase shift line 52 is disposed on one of a path connecting the peaking amplifier 12 and the input-side coil 211 or a path connecting the carrier amplifier 11 and the input-side coil 211.

The capacitor 41 is an example of a first cutoff capacitor and is disposed in series on a path connecting the output terminal of the carrier amplifier 11 and the harmonic reduction circuit 31. The aforementioned disposition of the capacitor 41 enables a DC supply voltage (current) supplied to the carrier amplifier 11 to be prevented from leaking to the harmonic reduction circuit 31 and the transformer 21.

The capacitor 42 is an example of a second cutoff capacitor and is disposed in series on a path connecting the output terminal of the peaking amplifier 12 and the harmonic reduction circuit 32. The aforementioned disposition of the capacitor 42 enables a DC supply voltage (current) supplied to the peaking amplifier 12 to be prevented from leaking to the harmonic reduction circuit 32 and the transformer 21.

In the configuration of the harmonic reduction circuit 32, the two inductors 322 and 323 are connected in series, and there is a possibility that a DC voltage (current) leaks to the ground via the harmonic reduction circuit 32. To address this, the disposition of the capacitors 41 and 42 enables a DC supply voltage (current) supplied to the carrier amplifier 11 and the peaking amplifier 12 to be prevented from leaking to the ground via the harmonic reduction circuit 32.

Assuming the carrier amplifier 11 and the peaking amplifier 12 have a configuration for preventing the DC supply voltage (current) from flowing to the output terminal of each of the carrier amplifier 11 and the peaking amplifier 12, the capacitors 41 and 42 may be considered as optional components.

[1.3 Signal Transmission Characteristics of Amplifier Circuit 10]

Figure 2:
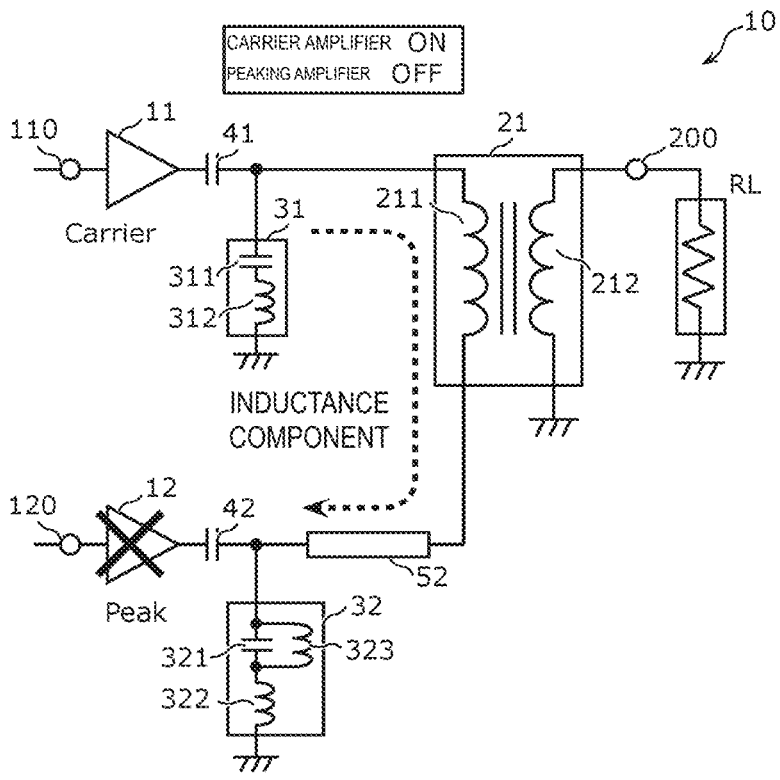
FIG. 2 is a circuit state diagram at the time of inputting a small signal according to the embodiment.

FIG. 2 is a circuit state diagram of the amplifier circuit 10 according to the embodiment at the time of inputting a small signal. Assuming a small signal is input to the amplifier circuit 10 as illustrated in the figure, the carrier amplifier 11 operates (ON), and the peaking amplifier 12 does not operate (OFF).

In contrast, assuming a large signal is input to the amplifier circuit 10 (not illustrated), the carrier amplifier 11 and the peaking amplifier 12 operate (ON).

It the time of inputting a small signal in contrast to inputting a large signal, the output impedance of the carrier amplifier 11 becomes high. That is, at the time of inputting a small signal, the peaking amplifier 12 turns off, and the output impedance of the carrier amplifier 11 becomes high. It is possible for the amplifier circuit 10 to operate highly efficiently.

In contrast, at the time of inputting a large signal, the carrier amplifier 11 and the peaking amplifier 12 operate, and thereby it is possible to output a high power signal. In addition, low output impedance of the peaking amplifier 12 enables signal distortion reduction.

As illustrated in FIG. 1 and FIG. 2, in the amplifier circuit 10, the harmonic reduction circuits 31 and 32 for reducing second-order harmonic wave of a transmission signal output from the carrier amplifier 11 and the peaking amplifier 12 are added. For example, in the harmonic reduction circuit 31, the inductance value of the inductor 312 and the capacitance value of the capacitor 311 are set to match a LC series resonant frequency with the frequency of the second-order harmonic wave of a signal output from the carrier amplifier 11. For the harmonic reduction circuit 32, the inductance value and the capacitance value are likewise set.

In the amplifier circuit 10, it is thus possible to reduce the second-order harmonic wave generated in the carrier amplifier 11 and the peaking amplifier 12 assuming the amplifiers operate (ON) (at the time of inputting a large signal).

Figure 3:
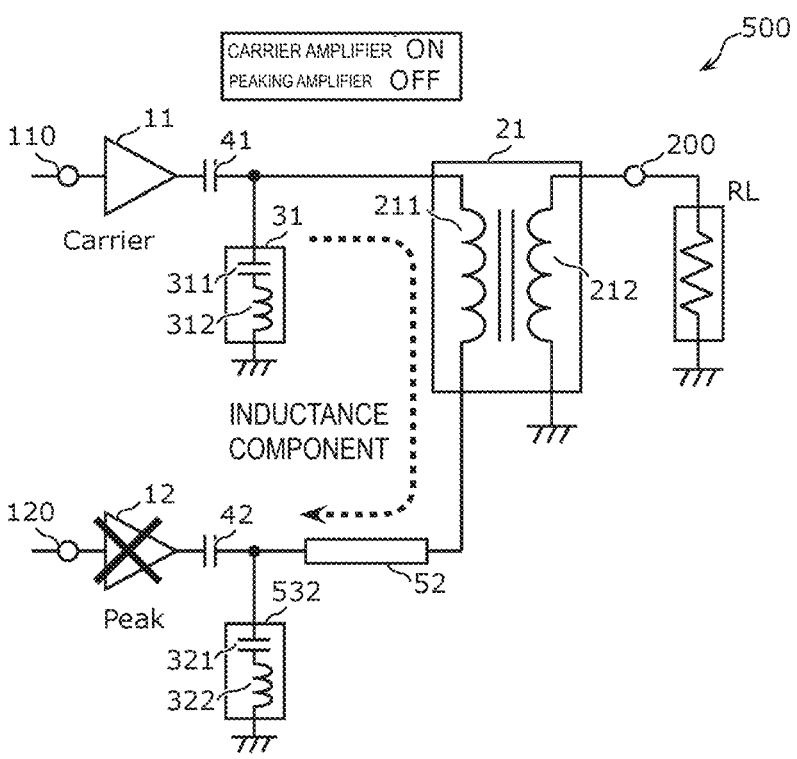
FIG. 3 is a circuit state diagram of an amplifier circuit according to the comparative example at the time of inputting a small signal.

FIG. 3 is a circuit state diagram of an amplifier circuit 500 according to a comparative example at the time of inputting a small signal. In comparison with the amplifier circuit 10 according to the embodiment, the amplifier circuit 500 according to the comparative example illustrated in the figure is different in configuration that the amplifier circuit 500 has a harmonic reduction circuit 532, instead of the harmonic reduction circuit 32. Hereinafter, regarding the amplifier circuit 500 according to the comparative example, the description of the same configuration points as those of the amplifier circuit 10 according to the embodiment is omitted, and a different configuration point will be described.

The harmonic reduction circuit 532 has the inductor 322 and the capacitor 321 that are connected in series to each other. The inductor 322 and the capacitor 321 are disposed in series on the path connecting the output terminal of the peaking amplifier 12 and the ground. The circuit configuration mentioned above causes the inductor 322 and the capacitor 321 to form a LC series resonant circuit, and the impedance thereof becomes minimum at a LC series resonant frequency of the LC series resonant circuit. Assuming the resonance frequency is set at the frequency of the second-order harmonic wave of the transmission signal input from the terminal 120, the second-order harmonic wave component of the transmission signal output from the peaking amplifier 12 may thereby be prevented from leaking to a portion closer to the transformer 21 than to the harmonic reduction circuit 532.

However, assuming the carrier amplifier 11 operates (ON), and assuming the peaking amplifier 12 does not operate (OFF) (at the time of inputting a small signal) in the amplifier circuit 500 according to the comparative example, the LC series resonant frequency specified based on the harmonic reduction circuits 31 and 532 is shifted from the frequency of the second-order harmonic wave toward the fundamental wave frequency on occasions. The following is cited as a cause of this. Assuming the peaking amplifier 12 does not operate, impedance in a view of the harmonic reduction circuit 532 from the output terminal of the carrier amplifier 11 is added in series to an inductance component of the transformer 21, and thus the LC series resonant frequency of the harmonic reduction circuit 532 is shifted to the lower frequency side.

In contrast, in the amplifier circuit 10 according to the embodiment, the inductor 323 is connected in parallel to the capacitor 321 of the harmonic reduction circuit 32. Accordingly, in comparison with the amplifier circuit 500 according to the comparative example, it is possible to make higher the impedance of the harmonic reduction circuit 32 in the fundamental wave frequency (open circuit) and to shift the LC series resonant frequency to the second-order harmonic wave side. That is, in the amplifier circuit 10 according to the embodiment, in comparison with the amplifier circuit 500 according to the comparative example, assuming the carrier amplifier 11 operates, and assuming the peaking amplifier 12 does not operate (at the time of inputting a small signal), it is possible to avoid the matching of the LC series resonant frequency specified based on the harmonic reduction circuit 32 with the signal output from the fundamental wave frequency of each amplifier.

Figure 4:
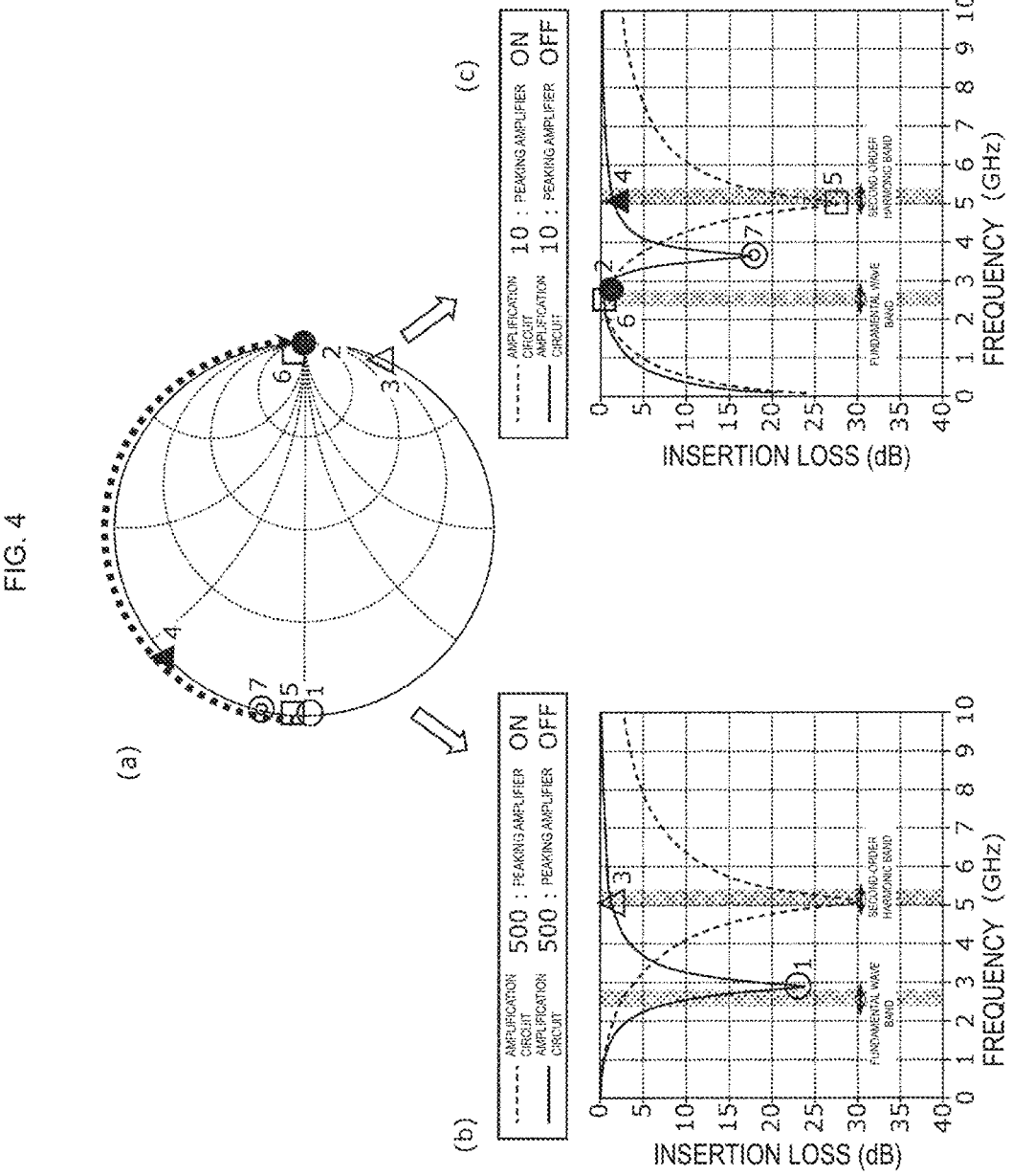
FIG. 4 is a graph in which the frequency characteristics of LC series circuits according to the embodiment and a comparative example are compared.

FIG. 4 is a graph in which the signal transmission characteristics of the amplifier circuit 10 according to the embodiment and the amplifier circuit 500 according to the comparative example are compared. FIG. 4 illustrates, in (a), the Smith chart representing impedances in a view, toward the transformer 21, from the output terminal of the carrier amplifier 11 in the respective amplifier circuits 10 and 500. FIG. 4 also illustrates, in (b), a bandpass characteristic of a transmission signal from the output terminal of the carrier amplifier 11 in the amplifier circuit 500 to the transformer 21. FIG. 4 also illustrates, in (c), a bandpass characteristic of a transmission signal from the output terminal of the carrier amplifier 11 in the amplifier circuit 10 to the transformer 21.

As illustrated in (b) in FIG. 4, in the amplifier circuit 500 according to the comparative example, assuming the carrier amplifier 11 and the peaking amplifier 12 both operate (ON) (at the time of inputting a large signal), the LC series resonant frequency of the harmonic reduction circuits 31 and 532 is located near the second-order harmonic wave of a transmission signal. Accordingly, a signal component of the fundamental wave frequency of the transmission signal output from the carrier amplifier 11 is transmitted with low loss, and the signal component of the second-order harmonic wave is attenuated (the broken line in (b) in FIG. 4). In contrast, assuming the carrier amplifier 11 operates (ON), and assuming the peaking amplifier 12 does not operate (OFF) (at the time of inputting a small signal), the signal component of the fundamental wave frequency of the transmission signal output from the carrier amplifier 11 is attenuated (the solid line in (b) in FIG. 4). This is attributed to the shifting of the LC series resonant frequency of the harmonic reduction circuit 532 to the lower frequency side because non-operation of the peaking amplifier 12 causes the inductance component of the harmonic reduction circuit 532 and the transformer 21 to be added in series to impedance in a view, toward the transformer 21, from the output terminal of the carrier amplifier 11. At this time, as illustrated in (a) in FIG. 4, the impedance in a view, toward the transformer 21, from the output terminal of the carrier amplifier 11 is low impedance at the fundamental wave frequency (short circuit: a marker 1 in the figure), and is high impedance at the frequency of the second-order harmonic wave (close to an open circuit: a marker 3 in the figure).

As illustrated in (c) in FIG. 4, in the amplifier circuit 10 according to the embodiment, assuming the carrier amplifier 11 and the peaking amplifier 12 both operate (ON) (at the time of inputting a large signal), the LC series resonant frequency of the harmonic reduction circuits 31 and 32 is located near the second-order harmonic wave of a transmission signal. Accordingly, a signal component of the fundamental wave frequency of the transmission signal output from the carrier amplifier 11 is transmitted with low loss, and the signal component of the second-order harmonic wave is attenuated (the broken line in (c) in FIG. 4). In contrast, assuming the carrier amplifier 11 operates (ON), and assuming the peaking amplifier 12 does not operate (OFF) (at the time of inputting a small signal), the signal component of the fundamental wave frequency of the transmission signal output from the carrier amplifier 11 is transmitted with low loss (the solid line in (c) in FIG. 4). This is attributed to the non-shifting of the LC series resonant frequency to the fundamental wave frequency, the non-shifting being caused by the following. Although the non-operation of the peaking amplifier 12 causes the inductance component of the transformer 21 and the harmonic reduction circuit 32 to be added in series to the impedance in a view, toward the transformer 21, from the output terminal of the carrier amplifier 11, the inductor 323 connected in parallel to the capacitor 321 is added to the harmonic reduction circuit

32. At this time, as illustrated in (a) in FIG. 4, the impedance in a view, toward the transformer 21, from the output terminal of the carrier amplifier 11 is high impedance at the fundamental wave frequency (the open circuit: a marker 2 in the figure) and is low impedance at the frequency of the second-order harmonic wave due to the capacitance of the capacitor 321 (near the short circuit: a marker 4 in the figure). It is understood that this is because the inductor 323 of the harmonic reduction circuit 32 according to the embodiment causes the impedance of the fundamental wave in the comparative example (the marker 1 in the figure) to shift to the impedance of the fundamental wave in the embodiment (the marker 2 in the figure). As the result of this, assuming the carrier amplifier 11 operates (ON), and assuming the peaking amplifier 12 does not operate (OFF) (at the time of inputting a small signal), the fundamental wave component of the transmission signal output from the carrier amplifier 11 is transmitted with low loss (the marker 2 in (c) in FIG. 4), and the second-order harmonic wave component is attenuated (the marker 4 in (c) in FIG. 4).

Accordingly, in each of the case where the carrier amplifier 11 and the peaking amplifier 12 both operate (ON) (at the time of inputting a large signal) and the case where the carrier amplifier 11 operates (ON) and the peaking amplifier 12 does not operate (OFF) (at the time of inputting a small signal), the radio frequency circuit 1 according to the embodiment enables harmonic wave reduction without deterioration of the transmission characteristic of the fundamental wave.

[1.4 Circuit Configuration of Radio Frequency Circuit According to Modification 1]

A radio frequency circuit according to Modification 1 will then be described. The radio frequency circuit according to this modification includes an amplifier circuit 10A, the filters 82 and 83, the switches 81 and 84, the input terminal 101, and the antenna connection terminal 102. The radio frequency circuit according to this modification is different only in the configuration of the amplifier circuit 10A in comparison with the radio frequency circuit 1 according to the embodiment. Hereinafter, regarding the radio frequency circuit according to this modification, the description of the same configuration points as those of the radio frequency circuit 1 according to the embodiment is omitted, and the amplifier circuit 10A having a different configuration will be described.

Figure 5:
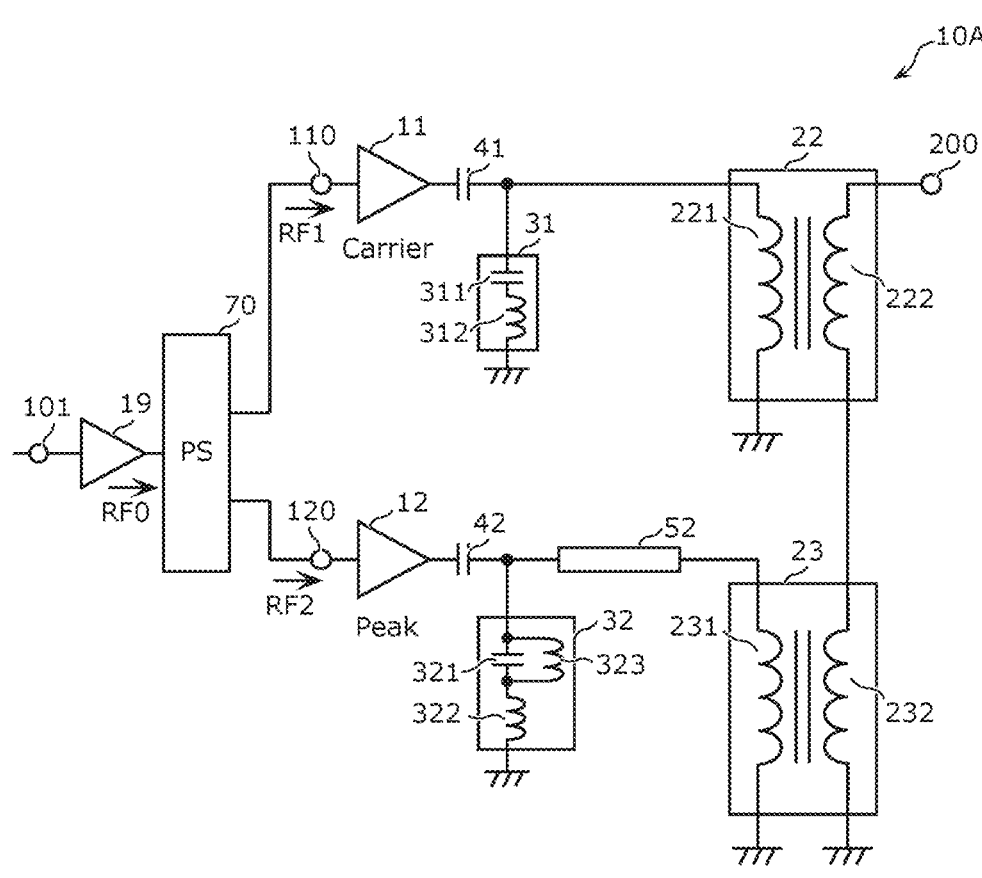
FIG. 5 is a circuit configuration diagram of an amplifier circuit according to Modification 1.

FIG. 5 is a circuit configuration diagram of the amplifier circuit 10A according to Modification 1. The amplifier circuit 10A includes the carrier amplifier 11, the peaking amplifier 12, the preamplifier 19, the phase shift circuit 70, transformers 22 and 23, the harmonic reduction circuits 31 and 32, the phase shift line 52, the capacitors 41 and 42, and the signal output terminal 200. In comparison with the amplifier circuit 10 according to the embodiment, the amplifier circuit 10A according to this modification is different only in the configuration of the transformers 22 and 23. Hereinafter, the description of the same configuration points as those of the amplifier circuit 10 according to the embodiment is omitted, the amplifier circuit 10A according to this modification will be described focused on different configuration points.

The transformer 22 is an example of a first transformer and has an input-side coil 221 (first input-side coil) and an output-side coil 222 (first output-side coil). One end of the input-side coil 221 is connected to the output terminal of the carrier amplifier 11 with the capacitor 41 interposed therebetween. The other end of the input-side coil 221 is connected to the ground. One end of the output-side coil 222 is connected to the signal output terminal 200, and the other end of the output-side coil 222 is connected to one end an output-side coil 232.

The transformer 23 is an example of a second transformer and has an input-side coil 231 (second input-side coil) and the output-side coil 232 (a second output-side coil). One end of the input-side coil 231 is connected to the output terminal of the peaking amplifier 12 with the capacitor 42 and the phase shift line 52 interposed therebetween. The other end of the input-side coil 231 is connected to the ground. The one end of the output-side coil 232 is connected to the other end of the output-side coil 222, and the other end of the output-side coil 232 is connected to the ground.

With the connection configuration above of the transformers 22 and 23, a signal output from the carrier amplifier 11 and a signal output from the peaking amplifier 12 are voltage-summed, and a combined output signal is output from the signal output terminal 200.

In the harmonic reduction circuit 31, the one end thereof is connected to a point on a path connecting the output terminal of the carrier amplifier 11 and the one end of the input-side coil 221, and the other end thereof is connected to the ground. The inductor 312 and the capacitor 311 form a LC series resonant circuit, and the impedance thereof becomes minimum (short circuit) at the LC series resonant frequency of the LC series resonant circuit. Assuming the LC series resonant frequency is set at the frequency of the second-order harmonic wave of a transmission signal input from the terminal 110, the second-order harmonic wave component of the transmission signal output from the carrier amplifier 11 may thereby be prevented from leaking to a portion closer to the transformer 22 than to the harmonic reduction circuit 31.

In the harmonic reduction circuit 32, the one end thereof is connected to a point on a path connecting the output terminal of the peaking amplifier 12 and the one end of the input-side coil 231, and the other end thereof is connected to the ground. The inductor 322 and the capacitor 321 form a LC series resonant circuit, the impedance thereof becomes minimum (short circuit) at the LC series resonant frequency of the LC series resonant circuit. Assuming the LC series resonant frequency is set at the frequency of the second-order harmonic wave of a transmission signal input from the terminal 120, the second-order harmonic wave component of a transmission signal output from the peaking amplifier 12 may thereby be prevented from leaking to a portion closer to the transformer 23 than to the harmonic reduction circuit 32. The harmonic reduction circuit 31 and the harmonic reduction circuit 32 do not have the same circuit configuration. For example, the inductor 323 is connected in parallel to the capacitor 321 in the harmonic reduction circuit 32, while an inductor is not connected in parallel to the capacitor 311 in the harmonic reduction circuit 31.

The one end of the phase shift line 52 is connected to the output terminal of the peaking amplifier 12 with the capacitor 42 interposed therebetween, and the other end of the phase shift line 52 is connected to the one end of the input-side coil 231. The one end of the phase shift line 52 may be connected to the output terminal of the carrier amplifier 11 with the capacitor 41 interposed therebetween, and the other end of the phase shift line 52 may be connected to the one end of the input-side coil 221.

The capacitor 41 is an example of a first cutoff capacitor and is disposed in series on a path connecting the output terminal of the carrier amplifier 11 and the harmonic reduction circuit 31. The aforementioned disposition of the capacitor 41 enables a DC supply voltage (current) supplied to the carrier amplifier 11 to be prevented from leaking to the harmonic reduction circuit 31 and the transformer 22.

The capacitor 42 is an example of a second cutoff capacitor and is disposed in series on a path connecting the output terminal of the peaking amplifier 12 and the harmonic reduction circuit 32. The aforementioned disposition of the capacitor 42 enables a DC supply voltage (current) supplied to the peaking amplifier 12 to be prevented from leaking to the harmonic reduction circuit 32 and the transformer 23. Assuming the carrier amplifier 11 and the peaking amplifier 12 have the configuration for preventing the DC supply voltage (current) from flowing to the output terminal of each of the carrier amplifier 11 and the peaking amplifier 12, the capacitors 41 and 42 may be optional components.

In the amplifier circuit 10A according to this modification, the inductor 323 is connected in parallel to the capacitor 321 of the harmonic reduction circuit 32, and thus it is possible to make higher the impedance of the harmonic reduction circuit 32 in the fundamental wave frequency (open circuit) and to shift the LC series resonant frequency to the second-order harmonic wave side. That is, in the amplifier circuit 10A according to this modification, assuming the carrier amplifier 11 operates, and assuming the peaking amplifier 12 does not operate (at the time of inputting a small signal), it is possible to avoid the matching of the LC series resonant frequency specified based on the harmonic reduction circuit 32 with the signal output from the fundamental wave frequency of each amplifier.

Accordingly, in each of the case where the carrier amplifier 11 and the peaking amplifier 12 both operate (ON) (at the time of inputting a large signal) and the case where the carrier amplifier 11 operates (ON) and the peaking amplifier 12 does not operate (OFF) (at the time of inputting a small signal), the radio frequency circuit according to this modification enables harmonic wave reduction without deterioration of the transmission characteristic of the fundamental wave.

[1.5 Circuit Configuration of Radio Frequency Circuit According to Modification 2]

A radio frequency circuit according to Modification 2 will then be described. The radio frequency circuit according to this modification includes an amplifier circuit 10B, the filters 82 and 83, the switches 81 and 84, the input terminal 101, and the antenna connection terminal 102. In comparison with the radio frequency circuit according to Modification 1, the radio frequency circuit according to this modification is different only in the configuration of the amplifier circuit 10B. Hereinafter, regarding the radio frequency circuit according to this modification, the description of the same configuration points as those of the radio frequency circuit according to Modification 1 is omitted, and the amplifier circuit 10B having different configuration will be described.

Figure 6:
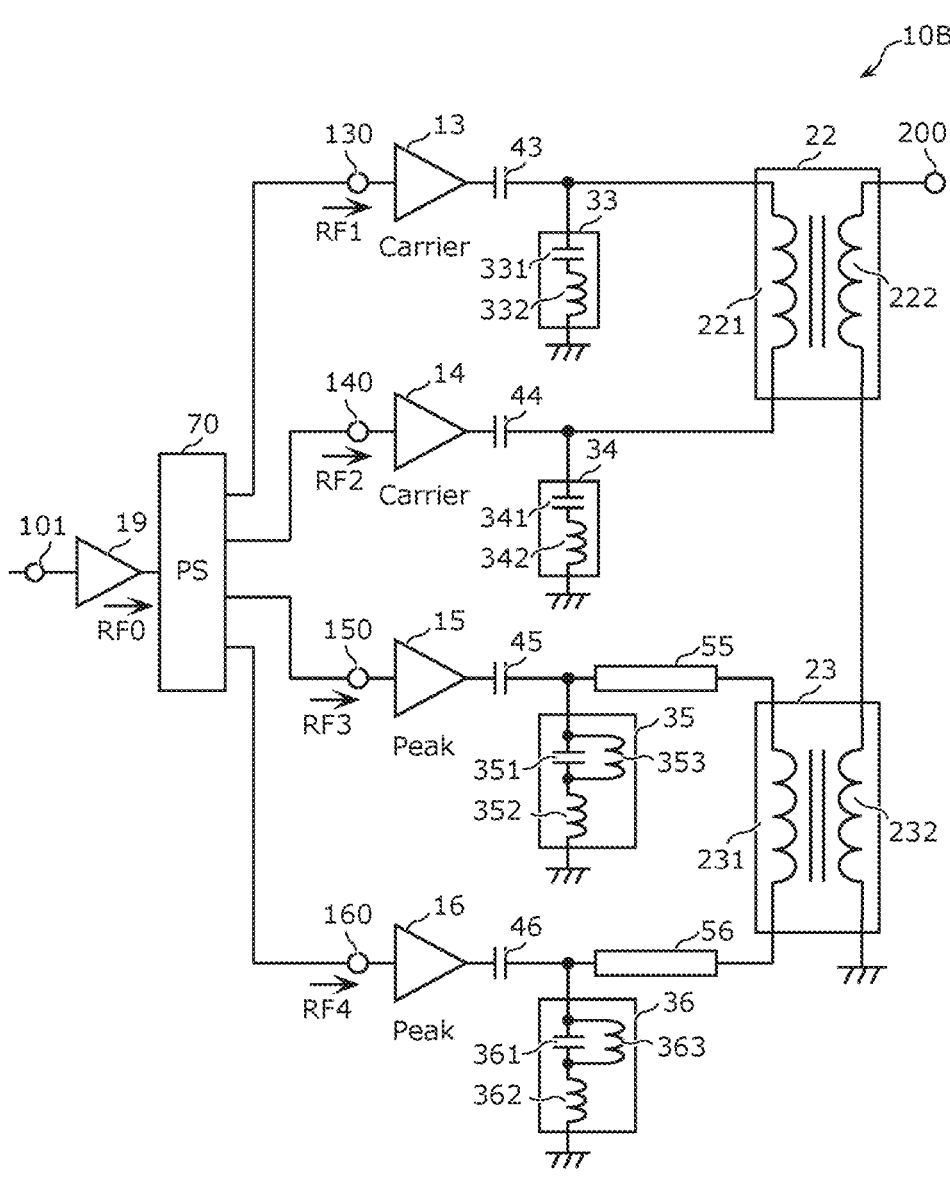
FIG. 6 is a circuit configuration diagram of an amplifier circuit according to Modification 2.

FIG. 6 is a circuit configuration diagram of the amplifier circuit 10B according to Modification 2. The amplifier circuit 10B includes carrier amplifiers 13 and 14, peaking amplifiers 15 and 16, the preamplifier 19, the phase shift circuit 70, the transformers 22 and 23, harmonic reduction circuits 33, 34, 35, and 36, phase shift lines 55 and 56, capacitors 43, 44, 45, and 46, and the signal output terminal 200. In comparison with the amplifier circuit 10A according to Modification 1, the amplifier circuit 10B according to this modification is different mainly in a point that the carrier amplifiers 13 and 14 of a differential amplification type and the peaking amplifiers 15 and 16 of the differential amplification type are provided. Hereinafter, the description of the same configuration points as those of the amplifier circuit 10A according to Modification 1 is omitted, and the amplifier circuit 10B according to this modification will be described focused on different configuration points.

The phase shift circuit 70 splits a signal RF0 output from the preamplifier 19 and outputs the signals RF1 and RF2 and signals RF3 and RF4 that result from the splitting to the carrier amplifiers 13 and 14 and the peaking amplifiers 15 and 16 via terminals 130, 140, 150, and 160, respectively. At this time, the phase shift circuit 70 adjusts the phase of each of the signals RF1 to RF4. For example, the phase shift circuit 70 shifts the signal RF1 by +90 degrees with respect to the RF0 (advances the signal RF1 by 90 degrees), shifts the signal RF2 by −90 degrees with respect to the RF0 (delays the signal RF2 by 90 degrees), shifts the signal RF3 by zero degrees with respect to the RF0 (does not phase-shift), and shifts the signal RF4 by +180 degrees with respect to the RF0 (advances the signal RF4 by 180 degrees).

This enables the RF1 and the RF2 to have a 180 degree phase difference and the RF3 and the RF4 to have the 180 degree phase difference. That is, the carrier amplifiers 13 and 14 become able to function as a pair of differential amplifiers, and the peaking amplifiers 15 and 16 become able to function as a pair of differential amplifiers.

The preamplifier 19 and the phase shift circuit 70 may be optional components of the amplifier circuit 10B.

Each of the carrier amplifiers 13 and 14 and the peaking amplifiers 15 and 16 has an amplifying transistor. The amplifying transistor above is, for example, a bipolar transistor such as a HBT or a field effect transistor such as a MOSFET.

The carrier amplifiers 13 and 14 are respectively examples of a first amplification device and third amplification device. The carrier amplifiers 13 and 14 are each a Class A (or Class AB) amplifier circuit capable of amplification operation, for example, for all power levels of the signals RF1 and RF2 and capable of highly efficient amplification operation particularly in a low output area and a medium output area. The first amplification device and the third amplification device according to the present disclosure are only required to be a Class A (or Class AB) amplifier circuit and are not limited to a carrier amplifier.

The peaking amplifiers 15 and 16 are respectively examples of the second amplification device and a fourth amplification device and are, for example, a Class C amplifier circuit capable of amplification operation in an area where the power levels of the signals RF3 and RF4 are high. A bias voltage lower than a bias voltage is applied to the amplifying transistor of each of the carrier amplifiers 13 and 14. Accordingly, the higher the power levels of the signals RF3 and RF4, the lower output impedance. This enables the peaking amplifiers 15 and 16 to perform the amplification operation with low distortion in the high output area. The second amplification device and the fourth amplification device according to the present disclosure are only required to be a Class C amplifier circuit and not limited to a peaking amplifier.

The transformer 22 is an example of a first transformer and has the input-side coil 221 (a first input-side coil) and the output-side coil 222 (a first output-side coil). The one end of the input-side coil 221 is connected to the output terminal of the carrier amplifier 13 with the capacitor 43 interposed therebetween. The other end of the input-side coil 221 is connected to the output terminal of the carrier amplifier 14 with the capacitor 44 interposed therebetween. The one end of the output-side coil 222 is connected to the signal output terminal 200, and the other end of the output-side coil 222 is connected to the one end of the output-side coil 232.

The transformer 23 is an example of a second transformer and has the input-side coil 231 (a second input-side coil) and the output-side coil 232 (a second output-side coil). The one end of the input-side coil 231 is connected to the output terminal of the peaking amplifier 15 with the capacitor 45 and the phase shift line 55 interposed therebetween. The other end of the input-side coil 231 is connected to the output terminal of the peaking amplifier 16 with the capacitor 46 and the phase shift line 56 interposed therebetween. The one end of the output-side coil 232 is connected to the other end of the output-side coil 222, and the other end of the output-side coil 232 is connected to the ground.

The connection configuration above of the transformers 22 and 23 causes differential signals output from the carrier amplifiers 13 and 14 and differential signals output from the peaking amplifiers 15 and 16 are voltage-summed, and a combined output signal is output from the signal output terminal 200.

The harmonic reduction circuit 33 is an example of a first circuit in this modification and has an inductor 332 (first inductor) and a capacitor 331 (first capacitor) that are connected in series to each other. The inductor 332 and the capacitor 331 are disposed in series on a path connecting the output terminal of the carrier amplifier 13 and the ground. More specifically, in the harmonic reduction circuit 33, one end thereof is connected to a point on a path connecting the output terminal of the carrier amplifier 13 and the one end of the input-side coil 221, and the other end thereof is connected to the ground. In this modification, of the inductor 332 and the capacitor 331, the inductor 332 is connected on the ground side, but the capacitor 331 may be connected on the ground side. The circuit configuration mentioned above causes the inductor 332 and the capacitor 331 to form a LC series resonant circuit, and the impedance thereof becomes minimum (short circuit) at the LC series resonant frequency of the LC series resonant circuit. Assuming the LC series resonant frequency is set at the frequency of the second-order harmonic wave of the transmission signal input from the terminal 130, the second-order harmonic wave component of the transmission signal output from the carrier amplifier 13 may thereby be prevented from leaking to a portion closer to the transformer 22 than to the harmonic reduction circuit 33.

The harmonic reduction circuit 35 is an example of a second circuit in this embodiment and has an inductor 352 (second inductor) and a capacitor 351 (second capacitor) that are connected in series to each other and an inductor 353 (third inductor) connected in parallel to the capacitor 351. The inductor 352 and the capacitor 351 are disposed in series on a path connecting the output terminal of the peaking amplifier 15 and the ground. More specifically, in the harmonic reduction circuit 35, the one end thereof is connected to a point on a path connecting the output terminal of the peaking amplifier 15 and the one end of the input-side coil 231, and the other end thereof is connected to the ground. In this modification, of the inductor 352 and the capacitor 351, the inductor 352 is connected on the ground side, but the capacitor 351 may be connected on the ground side. The circuit configuration mentioned above causes the inductor 352 and the capacitor 351 to form a LC series resonant circuit, and the impedance thereof becomes minimum (short circuit) at the LC series resonant frequency of the LC series resonant circuit. Assuming the LC series resonant frequency is set at the frequency of the second-order harmonic wave of a transmission signal input from the terminal 150, the second-order harmonic wave component of the transmission signal output from the peaking amplifier 15 may thereby be prevented from leaking to a portion closer to the transformer 23 than to the harmonic reduction circuit 35.

The harmonic reduction circuit 34 is an example of a third circuit in this modification and has an inductor 342 (fourth inductor) and a capacitor 341 (third capacitor) that are connected in series to each other. The inductor 342 and the capacitor 341 are disposed in series on a path connecting the output terminal of the carrier amplifier 14 and the ground. More specifically, in the harmonic reduction circuit 34, one end thereof is connected to a point on a path connecting the output terminal of the carrier amplifier 14 and the other end of the input-side coil 221, and the other end thereof is connected to the ground. In this modification, of the inductor 342 and the capacitor 341, the inductor 342 is connected on the ground side, but the capacitor 341 may be connected on the ground side. The circuit configuration mentioned above causes the inductor 342 and the capacitor 341 to form a LC series resonant circuit, and the impedance thereof becomes minimum (short circuit) at the LC series resonant frequency of the LC series resonant circuit. Assuming the LC series resonant frequency is set at the frequency of the second-order harmonic wave of a transmission signal input from the terminal 140, the second-order harmonic wave component of the transmission signal output from the carrier amplifier 14 may thereby be prevented from leaking to a portion closer to the transformer 22 than to the harmonic reduction circuit 34.

The harmonic reduction circuit 36 is an example of a fourth circuit in this embodiment and has an inductor 362 (fifth inductor) and a capacitor 361 (fourth capacitor) that are connected in series to each other and an inductor 363 (sixth inductor) connected in parallel to the capacitor 361. The inductor 362 and the capacitor 361 are disposed in series on a path connecting the output terminal of the peaking amplifier 16 and the ground. More specifically, in the harmonic reduction circuit 36, one end thereof is connected to a point on a path connecting the output terminal of the peaking amplifier 16 and the other end of the input-side coil 231, and the other end thereof is connected to the ground. In this modification, of the inductor 362 and the capacitor 361, the inductor 362 is connected on the ground side, but the capacitor 361 may be connected on the ground side. The circuit configuration mentioned above causes the inductor 362 and the capacitor 361 to form a LC series resonant circuit, and the impedance thereof becomes minimum (short circuit) at the LC series resonant frequency of the LC series resonant circuit. Assuming the LC series resonant frequency is set at the frequency of the second-order harmonic wave of a transmission signal input from the terminal 160, the second-order harmonic wave component of the transmission signal output from the peaking amplifier 16 may thereby be prevented from leaking to a portion closer to the transformer 23 than to the harmonic reduction circuit 36.

The inductors 332, 342, 352, 353, 362, and 363 may be a coil conductor formed on or in a chip component or a substrate and may also be composed of a wiring line such as a wire. The harmonic reduction circuits 33 and 34 and the harmonic reduction circuits 35 and 36 do not have the same circuit configuration. For example, the inductor 353 is connected in parallel to the capacitor 351 in the harmonic reduction circuit 35, and the inductor 363 is connected in parallel to the capacitor 361 in the harmonic reduction circuit 36. However, the inductor is not connected in parallel to the capacitor 331 in the harmonic reduction circuit 33, and an inductor is not connected in parallel to the capacitor 341 in the harmonic reduction circuit 34.

The phase shift line 55 is an example of a first phase shift line and is, for example, a ¼ wavelength transmission line. The phase shift line 55 delays the phase of the radio frequency signal input from one end thereof by a ¼ wavelength and outputs the radio frequency signal from the other end thereof. The one end of the phase shift line 55 is connected to the output terminal of the peaking amplifier 15 with the capacitor 45 interposed therebetween, and the other end of the phase shift line 55 is connected to the one end of the input-side coil 231.

The one end of the phase shift line 55 may be connected to the output terminal of the carrier amplifier 13 with the capacitor 43 interposed therebetween, and the other end of the phase shift line 55 may be connected to the one end of the input-side coil 221. That is, the phase shift line 55 may be disposed on one of a path connecting the peaking amplifier 15 and the input-side coil 231 and a path connecting the carrier amplifier 13 and the input-side coil 221.

The phase shift line 56 is an example of a second phase shift line and is, for example, a ¼ wavelength transmission line. The phase shift line 56 delays the phase of the radio frequency signal input from one end thereof by a ¼ wavelength and outputs the radio frequency signal from the other end thereof. The one end of the phase shift line 56 is connected to the output terminal of the peaking amplifier 16 with the capacitor 46 interposed therebetween, and the other end of the phase shift line 56 is connected to the other end of the input-side coil 231.

The one end of the phase shift line 56 may be connected to the output terminal of the carrier amplifier 14 with the capacitor 44 interposed therebetween, and the other end of the phase shift line 56 may be connected to the other end of the input-side coil 221. That is, the phase shift line 56 may be disposed on one of a path connecting the peaking amplifier 16 and the input-side coil 231 and a path connecting the carrier amplifier 14 and the input-side coil 221.

The capacitor 43 is an example of a first cutoff capacitor and is disposed in series on a path connecting the output terminal of the carrier amplifier 13 and the harmonic reduction circuit 33. The aforementioned disposition of the capacitor 43 enables a DC supply voltage (current) supplied to the carrier amplifier 13 to be prevented from leaking to the harmonic reduction circuit 33 and the transformer 22.

The capacitor 45 is an example of a second cutoff capacitor and is disposed in series on a path connecting the output terminal of the peaking amplifier 15 and the harmonic reduction circuit 35. The aforementioned disposition of the capacitor 45 enables a DC supply voltage (current) supplied to the peaking amplifier 15 to be prevented from leaking to the harmonic reduction circuit 35 and the transformer 23.

The harmonic reduction circuit 35 has a configuration in which the two inductors 352 and 353 are connected in series and there is a possibility that a DC voltage (current) leaks to the ground via the harmonic reduction circuit 35. To address this, the disposition of the capacitor 45 enables, to be avoided, the leaking of a DC supply voltage (current) supplied to the peaking amplifier 15 to the harmonic reduction circuit 35 via the capacitor 45.

The capacitor 44 is an example of a third cutoff capacitor and is disposed in series on a path connecting the output terminal of the carrier amplifier 14 and the harmonic reduction circuit 34. The aforementioned disposition of the capacitor 44 enables a DC supply voltage (current) supplied to the carrier amplifier 14 to be prevented from leaking to the harmonic reduction circuit 34 and the transformer 22.

The capacitor 46 is an example of a fourth cutoff capacitor and is disposed in series on a path connecting the output terminal of the peaking amplifier 16 and the harmonic reduction circuit 36. The aforementioned disposition of the capacitor 46 enables a DC supply voltage (current) supplied to the peaking amplifier 16 to be prevented from leaking to the harmonic reduction circuit 36 and the transformer 23.

The harmonic reduction circuit 36 has a configuration in which the two inductors 362 and 363 are connected in series, and there is a possibility that a DC voltage (current) leaks to the ground via the harmonic reduction circuit 36. To address this, the disposition of the capacitor 46 enables, to be avoided, the leaking of a DC supply voltage (current) supplied to the peaking amplifier 16 to the harmonic reduction circuit 36 via the capacitor 46.

Assuming the carrier amplifiers 13 and 14 and the peaking amplifiers 15 and 16 have the configuration for preventing the DC supply voltage (current) from flowing to the output terminal of each of the amplifiers, the capacitors 43 to 46 may be optional components.

In the amplifier circuit 10B according to this modification, the inductor 353 is connected in parallel to the capacitor 351 of the harmonic reduction circuit 35, and the inductor 363 is connected in parallel to the capacitor 361 of the harmonic reduction circuit 36. Accordingly, it is possible to make higher the impedance of the harmonic reduction circuits 35 and 36 in the fundamental wave frequency (open circuit) and to shift the LC series resonant frequency to the second-order harmonic wave side. That is, in the amplifier circuit 10B according to this modification, assuming the carrier amplifiers 13 and 14 operate, and assuming the peaking amplifiers 15 and 16 does not operate (at the time of inputting a small signal), it is possible to avoid the matching of the LC series resonant frequency specified based on the harmonic reduction circuits 35 and 36 with the signal output from the fundamental wave frequency of each amplifier.

Accordingly, in each of the case where the carrier amplifiers 13 and 14 and the peaking amplifiers 15 and 16 both operate (ON) (at the time of inputting a large signal) and the case where the carrier amplifiers 13 and 14 operate (ON) and the peaking amplifiers 15 and 16 do not operate (OFF) (at the time of inputting a small signal), the radio frequency circuit according to this modification enables harmonic wave reduction without deterioration of the transmission characteristic of the fundamental wave.

[1.6 Component Disposition Configuration of Radio Frequency Circuit 1]

The configuration of component mounting of the radio frequency circuit 1 according to the embodiment will then be described.

Figure 7:
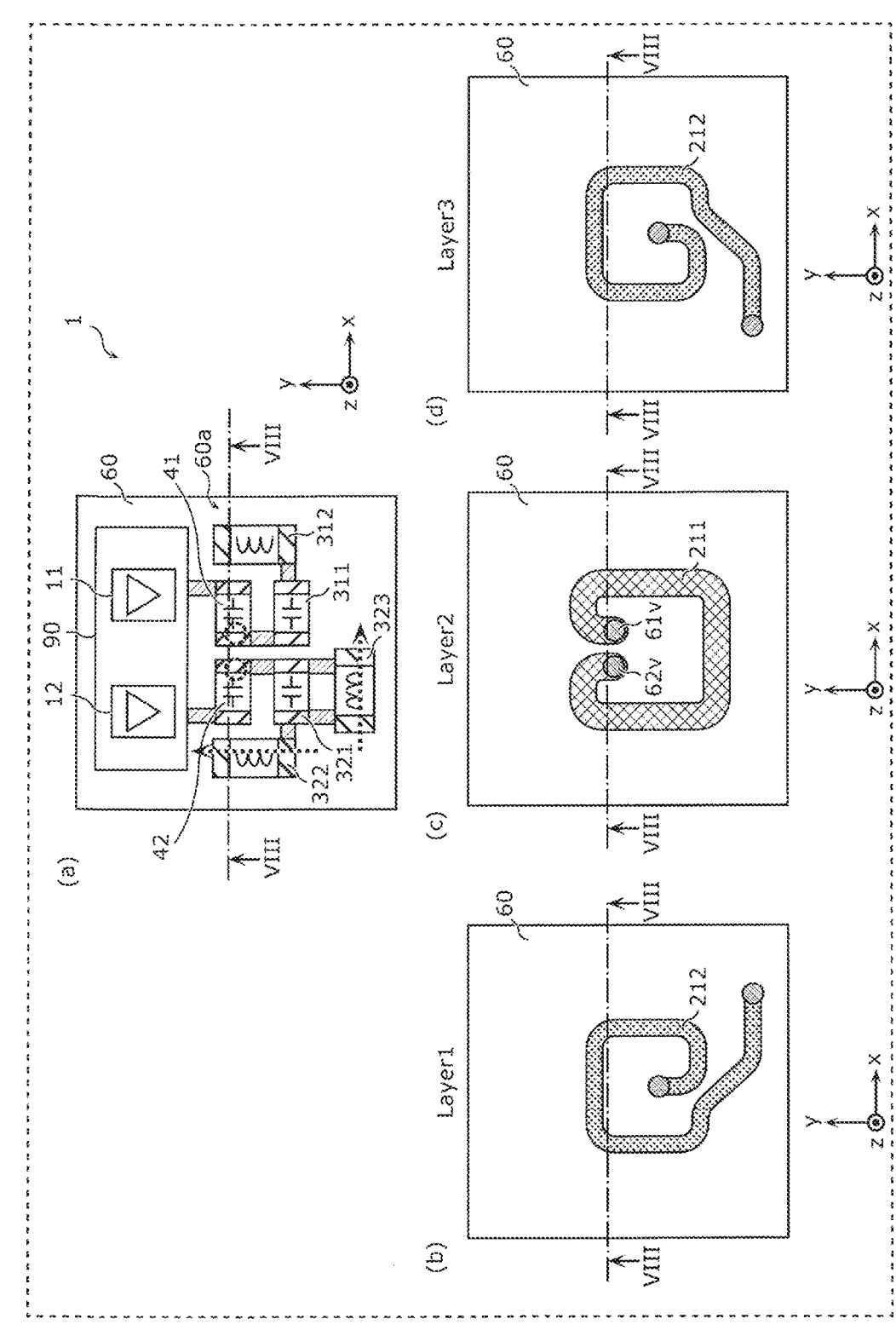
FIG. 7 is a plan view of a radio frequency circuit according to the embodiment.
Figure 8:
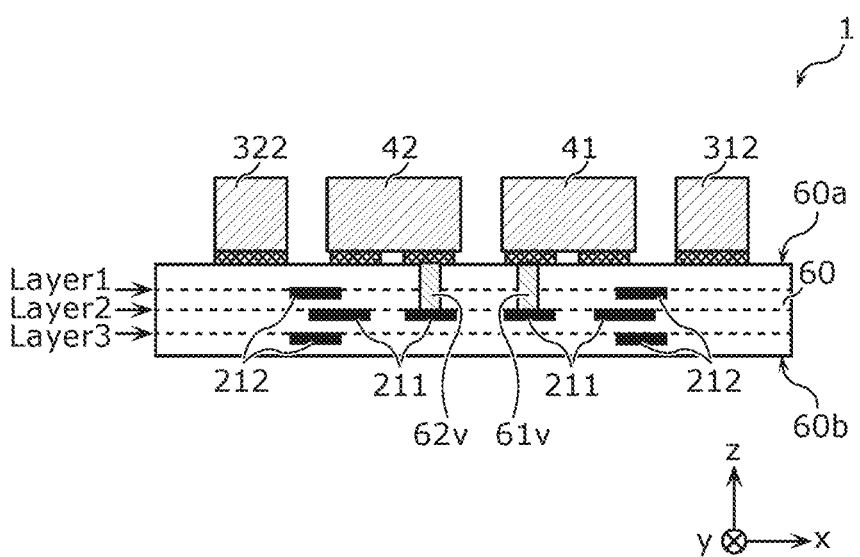
FIG. 8 is a cross-sectional view of the radio frequency circuit according to the embodiment.

FIG. 7 is a plan view of the radio frequency circuit 1 according to the embodiment. FIG. 8 is a cross-sectional view of the radio frequency circuit 1 according to the embodiment. FIG. 7 illustrates the circuit component disposition assuming the main surface of a substrate 60 and layers of the substrate 60 are viewed from the positive side of the z axis, and FIG. 8 illustrates the cross-sectional view taken along the VIII-VIII line in FIG. 7. In (a) in FIG. 7, the circuit component disposition is illustrated in a view of a main surface 60a of the substrate 60 from the positive side of the z axis. In (b) in FIG. 7, the circuit component disposition is illustrated in a perspective view of a first layer (Layer1) of the substrate 60 from the positive side of the z axis. In (c) in FIG. 7, the circuit component disposition is illustrated in a perspective view of a second layer (Layer2)

of the substrate 60 from the positive side of the z axis. In (d) in FIG. 7, the circuit component disposition is illustrated in a perspective view of a third layer (Layer3) of the substrate 60 from the positive side of the z axis. In (a) in FIG. 7, for easy understanding disposition relationship among the circuit components, marks indicating the respective functions of some circuit components are indicated, but the actual circuit components are not denoted by the marks. In addition, in FIG. 7 and FIG. 8, the illustration of wiring connecting the substrate 60 and the circuit components is omitted.

The radio frequency circuit 1 may further include a resin member that covers a surface and the circuit components of the substrate 60 and a shield electrode layer that covers the surface of the resin member, but the illustration of the resin member and the shield electrode layer is omitted in FIG. 7 and FIG. 8.

The radio frequency circuit 1 further has the substrate 60 in addition to the circuit configuration illustrated in FIG. 1.

The substrate 60 is a substrate on which the circuit components constituting the radio frequency circuit 1 are mounted. As the substrate 60, for example, a low temperature co-fired ceramics (LTCC) substrate having a layered structure having a plurality of dielectric layers, a high temperature co-fired ceramics (HTCC) substrate, a component integrated board, a substrate having a rerouting layer (redistribution layer: RDL), a printed circuit board, or the like is used. The substrate 60 has the first layer (Layer1), the second layer (Layer2), and the third layer (Layer3).

On the surface of the substrate 60, a semiconductor IC 90, the capacitors 41, 42, 311, and 321, and the inductors 312, 322, and 323 are disposed.

The semiconductor IC 90 includes the carrier amplifier 11 and the peaking amplifier 12. The semiconductor IC 90 is configured by using, for example, a complementary metal oxide semiconductor (CMOS) and specifically, may be manufactured by a silicon on insulator (SOI) process. The semiconductor IC 90 may be formed from at least one of GaAs, SiGe, and GaN. The semiconductor material of the semiconductor IC 90 is not limited to the material described above.

The capacitors 41, 42, 311, and 321 and the inductors 312, 322, and 323 are each a surface mount device disposed on the surface of the substrate 60.

On the surface of or inside the substrate 60, the transformer 21 is formed. As illustrated in (c) in FIG. 7, the input-side coil 211 is formed as a flat conductor formed on the second layer (Layer2) of the substrate 60. The one end of the input-side coil 211 is connected to the capacitor 41 with a via conductor 61v interposed therebetween, and the other end of the input-side coil 211 is connected to the capacitor 42 with a via conductor 62v interposed therebetween. As illustrated in in (b) and (d) in FIG. 7, the output-side coil 212 is formed as a flat conductor formed on the first layer (Layer1) and the third layer (Layer3) of the substrate 60 and is disposed in such a manner as to sandwich the input-side coil 211 disposed on the second layer between the first layer and the third layer. In a plan view of the first layer to the third layer, the input-side coil 211 and the output-side coil 212 overlap at least partially.

The input-side coil 211 may be formed to extend in a plurality of layers. The output-side coil 212 may be formed in a single layer or to extend in three layers or more.

As illustrated in (a) in FIG. 7, a magnetic flux direction of the inductor 322 may be orthogonal to a magnetic flux direction of the inductor 323.

This enables magnetic coupling between the inductor 322 and the inductor 323 to be reduced and thus enables the harmonic wave reduction function of the harmonic reduction circuit 32 to be implemented with high accuracy. Accordingly, it is possible to perform harmonic wave reduction with high accuracy without deterioration of the transmission characteristic of the fundamental wave.

The inductor 322 is formed as a conductor coil formed inside the substrate 60, the inductor 323 is a surface mount device disposed on the surface of the substrate 60, and the magnetic flux direction of the inductor 322 may be orthogonal to the magnetic flux direction of the inductor 323.

Also in this case, it is possible to reduce the magnetic coupling between the inductor 322 and the inductor 323 and thus possible to perform harmonic wave reduction with high accuracy without deterioration of the transmission characteristic of the fundamental wave.

At least one of the capacitors 41, 42, 311, and 321 or the inductors 312, 322, and 323 may be included in the semiconductor IC 90. For example, the inductors 322 and 323 may be included in the semiconductor IC 90, and the magnetic flux direction of the inductor 322 may be orthogonal to the magnetic flux direction of the inductor 323.

This enables the radio frequency circuit 1 to be downsized and also the harmonic wave to be reduced with high accuracy without deterioration of the transmission characteristic of the fundamental wave.

Other circuit components included in the radio frequency circuit 1, that is, the filters 82 and 83, the switches 81 and 84, the input terminal 101, the antenna connection terminal 102, the preamplifier 19, the phase shift circuit 70, and the signal output terminal 200 (not illustrated) may be formed on the surface of or inside the substrate 60 or in a portion other than the substrate 60.

The radio frequency circuit according to Modification 1 and the radio frequency circuit according to Modification 2 may also have the same configuration as the component disposition configuration illustrated in FIG. 7 and FIG. 8.

For example, the radio frequency circuit according to Modification 1 further has the substrate 60, the semiconductor IC 90, the capacitors 41, 42, 311, and 321, and the inductors 312, 322, and 323 are disposed on the surface of the substrate 60, and the transformers 22 and 23 are formed on the surface of or inside the substrate 60.

The inductors 322 and 323 are surface mount devices, and the magnetic flux direction of the inductor 322 may be orthogonal to the magnetic flux direction of the inductor 323.

The inductor 322 is formed as a conductor coil formed inside the substrate 60, the inductor 323 is a surface mount device, and the magnetic flux direction of the inductor 322 may be orthogonal to the magnetic flux direction of the inductor 323.

These enable the radio frequency circuit according to Modification 1 to be downsized and also enable the harmonic wave to be reduced with high accuracy without deterioration of the transmission characteristic of the fundamental wave.

For example, the radio frequency circuit according to Modification 2 further has the substrate 60. A semiconductor IC including the carrier amplifiers 13 and 14 and the peaking amplifiers 15 and 16, the capacitors 43 to 46, 331, 341, 351, and 361, and the inductors 332, 342, 352, 353, 362, and 363 are disposed on the surface of the substrate 60, and the transformers 22 and 23 are formed on the surface of or inside the substrate 60.

The inductors 352, 353, 362, and 363 are a surface mount device, a magnetic flux direction of the inductor 352 is orthogonal to a magnetic flux direction of the inductor 353, and a magnetic flux direction of the inductor 362 may be orthogonal to a magnetic flux direction of the inductor 363.

The inductors 352 and 362 are formed as a conductor coil formed inside the substrate 60, the inductors 353 and 363 are a surface mount device, and the magnetic flux direction of the inductor 352 is orthogonal to the magnetic flux direction of the inductor 353, and the magnetic flux direction of the inductor 362 may be orthogonal to the magnetic flux direction of the inductor 363.

These enable the radio frequency circuit according to Modification 2 to be downsized and also enable the harmonic wave to be reduced with high accuracy without deterioration of the transmission characteristic of the fundamental wave.

2. Effects and Other Considerations

As described above, the radio frequency circuit 1 according to this embodiment includes the carrier amplifier 11, the peaking amplifier 12, the transformer 21 having the input-side coil 211 and the output-side coil 212, the signal output terminal 200 to which the one end of the output-side coil 212 is connected, the harmonic reduction circuits 31 and 32, and the phase shift line 52. The one end of the input-side coil 211 is connected to the output terminal of the carrier amplifier 11, the other end of the input-side coil 211 is connected to the output terminal of the peaking amplifier 12, and the other end of the output-side coil 212 is connected to the ground. The phase shift line 52 is connected between the output terminal of the carrier amplifier 11 and the one end of the input-side coil 211 or between the output terminal of the peaking amplifier 12 and the other end of the input-side coil 211. The harmonic reduction circuit 31 has the inductor 312 and the capacitor 311 that are connected in series to each other, and the inductor 312 and the capacitor 311 are disposed in series on the path connecting the ground and the point on the path connecting the output terminal of the carrier amplifier 11 and the one end of the input-side coil 211. The harmonic reduction circuit 32 has the inductor 322 and the capacitor 321 that are connected in series to each other and the inductor 323 connected in parallel to the capacitor 321, and the inductor 322 and the capacitor 321 are disposed in series on the path connecting the ground and the point on the path connecting the output terminal of the peaking amplifier 12 and the other end of the input-side coil 211.

Accordingly, the inductor 323 is connected in parallel to the capacitor 321 of the harmonic reduction circuit 32, it is thus possible to make higher the impedance of the harmonic reduction circuit 32 in the fundamental wave frequency (open circuit) and to shift the LC series resonant frequency to the second-order harmonic wave side, in comparison with the radio frequency circuit having the harmonic reduction circuit 532 without the inductor 323 connected in parallel thereto. That is, assuming the carrier amplifier 11 operates, and assuming the peaking amplifier 12 does not operate (at the time of inputting a small signal), it is possible to avoid the matching of the LC series resonant frequency specified based on the harmonic reduction circuit 32 with the signal output from the fundamental wave frequency of each amplifier. Accordingly, at the time of each of inputting a large signal and inputting a small signal, it is possible to perform harmonic wave reduction without deterioration of the transmission characteristic of the fundamental wave.

The radio frequency circuit according to Modification 1 includes the carrier amplifier 11, the peaking amplifier 12, the transformer 22 having the input-side coil 221 and the output-side coil 222, the transformer 23 having the input-side coil 231 and the output-side coil 232, the signal output terminal 200 to which the one end of the output-side coil 222 is connected, the harmonic reduction circuits 31 and 32, and the phase shift line 52. The one end of the input-side coil 221 is connected to the output terminal of the carrier amplifier 11, the other end of the input-side coil 221 is connected to the ground, the one end of the input-side coil 231 is connected to the output terminal of the peaking amplifier 12, the other end of the input-side coil 231 is connected to the ground, the other end of the output-side coil 222 is connected to the one end of the output-side coil 232, and the other end of the output-side coil 232 is connected to the ground. The phase shift line 52 is connected between the output terminal of the carrier amplifier 11 and the one end of the input-side coil 221 or between the output terminal of the peaking amplifier 12 and the one end of the input-side coil 231. The harmonic reduction circuit 31 has the inductor 312 and the capacitor 311 that are connected in series to each other, and the inductor 312 and the capacitor 311 are disposed in series on a path connecting the ground and the point on the path connecting the output terminal of the carrier amplifier 11 and the one end of the input-side coil 221. The harmonic reduction circuit 32 has the inductor 322 and the capacitor 321 that are connected in series to each other and the inductor 323 connected in parallel to the capacitor 321, and the inductor 322 and the capacitor 321 are disposed in series on a path connecting the ground and the point on the path connecting the output terminal of the peaking amplifier 12 and the one end of the input-side coil 231.

Accordingly, the inductor 323 is connected in parallel to the capacitor 321 of the harmonic reduction circuit 32, it is thus possible to make higher the impedance of the harmonic reduction circuit 32 in the fundamental wave frequency (open circuit) and to shift the LC series resonant frequency to the second-order harmonic wave side, in comparison with the radio frequency circuit having the harmonic reduction circuit 532 without the inductor 323 connected in parallel thereto. That is, assuming the carrier amplifier 11 operates, and assuming the peaking amplifier 12 does not operate (at the time of inputting a small signal), it is possible to avoid the matching of the LC series resonant frequency specified based on the harmonic reduction circuit 32 with the signal output from the fundamental wave frequency of each amplifier. Accordingly, at the time of each of inputting a large signal and inputting a small signal, it is possible to perform harmonic wave reduction without deterioration of the transmission characteristic of the fundamental wave.

For example, the radio frequency circuit 1 according to the embodiment and the radio frequency circuit according to Modification 1 may further include the capacitor 41 disposed in series on the path connecting the output terminal of the carrier amplifier 11 and the harmonic reduction circuit 31 and the capacitor 42 disposed in series on the path connecting the output terminal of the peaking amplifier 12 and the harmonic reduction circuit 32.

This enables a DC supply voltage (current) supplied to the carrier amplifier 11 and the peaking amplifier 12 to be prevented from leaking to the harmonic reduction circuits 31 and 32 and the transformer.

For example, the radio frequency circuit 1 according to the embodiment and the radio frequency circuit according to Modification 1 may further include the substrate 60, the inductors 322 and 323 may be a surface mount device disposed on the surface of the substrate 60, and the magnetic flux direction of the inductor 322 may be orthogonal to the magnetic flux direction of the inductor 323.

This enables the magnetic coupling between the inductor 322 and the inductor 323 to re reduced and thus enables the harmonic wave reduction function of the harmonic reduction circuit 32 to be implemented with high accuracy. It is thus possible to perform harmonic wave reduction with high accuracy without deterioration of the transmission characteristic of the fundamental wave.

For example, the radio frequency circuit 1 according to the embodiment and the radio frequency circuit according to Modification 1 may further include the substrate 60, the inductor 322 may be formed as the conductor coil formed inside the substrate 60, the inductor 323 may be a surface mount device disposed on the surface of the substrate 60, and the magnetic flux direction of the inductor 322 may be orthogonal to the magnetic flux direction of the inductor 323.

This enables the magnetic coupling between the inductor 322 and the inductor 323 to be reduced and thus enables the harmonic wave reduction function of the harmonic reduction circuit 32 to be implemented with high accuracy. It is thus possible to perform harmonic wave reduction with high accuracy without deterioration of the transmission characteristic of the fundamental wave.

The radio frequency circuit according to Modification 2 includes the carrier amplifiers 13 and 14, the peaking amplifiers 15 and 16, the transformer 22 having the input-side coil 221 and the output-side coil 222, the transformer 23 having the input-side coil 231 and the output-side coil 232, the signal output terminal 200 to which the one end of the output-side coil 222 is connected, the harmonic reduction circuits 33, 34, 35, and 36, and the phase shift lines 55 and 56. The one end of the input-side coil 221 is connected to the output terminal of the carrier amplifier 13, the other end of the input-side coil 221 is connected to the output terminal of the carrier amplifier 14, the one end of the input-side coil 231 is connected to the output terminal of the peaking amplifier 15, the other end of the input-side coil 231 is connected to the output terminal of the peaking amplifier 16, the other end of the output-side coil 222 is connected to the one end of the output-side coil 232, and the other end of the output-side coil 232 is connected to the ground. The phase shift line 55 is connected between the output terminal of the carrier amplifier 13 and the one end of the input-side coil 221 and the phase shift line 56 is connected between the output terminal of the carrier amplifier 14 and the other end of the input-side coil 221. Alternatively, the phase shift line 55 is connected between the output terminal of the peaking amplifier 15 and the one end of the input-side coil 231, and the phase shift line 56 is connected between the output terminal of the peaking amplifier 16 and the other end of the input-side coil 231. The harmonic reduction circuit 33 has the inductor 332 and the capacitor 331 that are connected in series to each other, the inductor 332 and the capacitor 331 are disposed in series on the path connecting the ground and the point on the path connecting the output terminal of the carrier amplifier 13 and the one end of the input-side coil 221. The harmonic reduction circuit 35 has the inductor 352 and the capacitor 351 that are connected in series to each other and the inductor 353 connected in parallel to the capacitor 351, and the inductor 352 and the capacitor 351 are disposed in series on the path connecting the ground and the point on the path connecting the output terminal of the peaking amplifier 15 and the one end of the input-side coil 231. The harmonic reduction circuit 34 has the inductor 342 and the capacitor 341 that are connected in series to each other, and the inductor 342 and the capacitor 341 are disposed in series on the path connecting the ground and the point on the path connecting the output terminal of the carrier amplifier 14 and the other end of the input-side coil 221. The harmonic reduction circuit 36 has the inductor 362 and the capacitor 361 that are connected in series to each other and the inductor 363 connected in parallel to the capacitor 361, and the inductor 362 and the capacitor 361 are disposed in series on the path connecting the ground and the point on the path connecting the output terminal of the peaking amplifier 16 and the other end of the input-side coil 231.

Accordingly, the parallel connection of the inductor 353 to the capacitor 351 of the harmonic reduction circuit 35 and the parallel connection of the inductor 363 to the capacitor 361 of the harmonic reduction circuit 36 enable the impedance of the harmonic reduction circuits 35 and 36 in the fundamental wave frequency (open circuit) to make higher and the LC series resonant frequency to the second-order harmonic wave side to be shifted. That is, assuming the carrier amplifiers 13 and 14 operate, and assuming the peaking amplifiers 15 and 16 does not operate (at the time of inputting a small signal), it is possible to avoid the matching of the LC series resonant frequency specified based on the harmonic reduction circuits 35 and 36 with the signal output from the fundamental wave frequency of each amplifier. Accordingly, at the time of each of inputting a large signal and inputting a small signal, it is possible to perform harmonic wave reduction without deterioration of the transmission characteristic of the fundamental wave.

For example, in the radio frequency circuit according to Modification 2, the carrier amplifiers 13 and 14 may form the pair of differential amplifiers, and the peaking amplifiers 15 and 16 may or may not form the pair of differential amplifiers.

For example, the radio frequency circuit according to Modification 2 may further include the capacitor 43 disposed in series on the path connecting the output terminal of the carrier amplifier 13 and the harmonic reduction circuit 33, the capacitor 45 disposed in series on the path connecting the output terminal of the peaking amplifier 15 and the harmonic reduction circuit 35, the capacitor 44 disposed in series on the path connecting the output terminal of the carrier amplifier 14 and the harmonic reduction circuit 34, and the capacitor 46 disposed in series on the path connecting the output terminal of the peaking amplifier 16 and the harmonic reduction circuit 36.

This enables a DC supply voltage (current) supplied to the carrier amplifiers 13 and 14 and the peaking amplifiers 15 and 16 to be prevented from leaking to the harmonic reduction circuits 33 to 36 and the transformer.

For example, the radio frequency circuit according to Modification 2 may further include the substrate 60, the inductors 352, 353, 362, and 363 may be a surface mount device disposed on the surface of the substrate 60, and the magnetic flux direction of the inductor 352 is orthogonal to the magnetic flux direction of the inductor 353, and the magnetic flux direction of the inductor 362 may be orthogonal to the magnetic flux direction of the inductor 363.

This enables magnetic coupling between the inductor 352 and the inductor 353 and magnetic coupling between the inductor 362 and the inductor 363 to be reduced, and thus enables the harmonic wave reduction function of the harmonic reduction circuits 35 and 36 to implement with high accuracy. It is thus possible to perform harmonic wave reduction with high accuracy without deterioration of the transmission characteristic of the fundamental wave.

For example, the radio frequency circuit according to Modification 2 may further include the substrate 60, the inductors 352 and 362 may be formed as the conductor coil formed inside the substrate 60, the inductors 353 and 363 may be a surface mount device disposed on the surface of the substrate 60, the magnetic flux direction of the inductor 352 may be orthogonal to the magnetic flux direction of the inductor 353, and the magnetic flux direction of the inductor 362 may be orthogonal to the magnetic flux direction of the inductor 363.

This enables the magnetic coupling between the inductor 352 and the inductor 353 and the magnetic coupling between the inductor 362 and the inductor 363 to be reduced and thus enables the harmonic wave reduction function of the harmonic reduction circuits 35 and 36 to be implemented with high accuracy. It is thus possible to perform harmonic wave reduction with high accuracy without deterioration of the transmission characteristic of the fundamental wave.

The communication device 8 according to this embodiment also includes the RFIC 7 that processes radio frequency signal and the radio frequency circuit 1 that transmits a radio frequency signal between the RFIC 7 and the antenna 6.

This enables the communication device 8 to exert the effects of the radio frequency circuit 1.

Other Embodiment and Others

The radio frequency circuit and the communication device according to the embodiment of the present disclosure have been described by using the embodiment and the modifications; however, the radio frequency circuit and the communication device according to the present disclosure are not limited to the embodiment and the modifications that are described above. Another embodiment implemented by combining any components in the embodiment and the modifications above, a modification obtained by applying, to the embodiment and the modifications above, a modification conceived of those skilled in the art without departing from the spirit of the present disclosure, and various types of equipment having the radio frequency circuit and the communication device above built therein are also included in the present disclosure.

For example, in each radio frequency circuit according to the embodiment and the modifications above, the harmonic reduction circuit has the configuration in which the inductor and the capacitor that are connected in series to each other are connected between the output terminal of a corresponding one of the amplifiers and the ground, but the configuration is not limited to this. The harmonic reduction circuit may have a circuit element apart from the inductor and the capacitor that are connected in series to each other.

For example, in the radio frequency circuit and the communication device according to the embodiment and the modifications above, another circuit element, wiring, or the like may be inserted between the paths connecting the circuit elements and the signal paths disclosed in the drawings.

INDUSTRIAL APPLICABILITY

The present disclosure is widely usable, as a radio frequency circuit disposed in a frontend section with multiband support, for communication devices such as a mobile phone.

REFERENCE SIGNS LIST 1 radio frequency circuit
6 antenna
7 RF signal processing circuit (RFIC)
8 communication device
10, 10A, 10B, 500 amplifier circuit
11, 13, 14 carrier amplifier
12, 15, 16 peaking amplifier
19 preamplifier
21, 22, 23 transformer
31, 32, 33, 34, 35, 36, 532 harmonic reduction circuit
41, 42, 43, 44, 45, 46, 311, 321, 331, 341, 351, 361 capacitor
52, 55, 56 phase shift line
60 substrate
60a, 60b main surface
61v, 62v via conductor
70 phase shift circuit
81, 84 switch
82, 83 filter
90 semiconductor IC
101 input terminal
102 antenna connection terminal
110, 120, 130, 140, 150, 160 terminal
200 signal output terminal
211, 221, 231 input-side coil
212, 222, 232 output-side coil
312, 322, 323, 332, 342, 352, 353, 362, 363 inductor

The invention claimed is:

1. A radio frequency circuit comprising:
a first amplification device and a second amplification device;
a transformer having an input-side coil and an output-side coil;
a signal output terminal to which an end of the output-side coil is connected;
a first circuit and a second circuit; and
a phase shift line,
wherein an end of the input-side coil is connected to an output terminal of the first amplification device, and another end of the input-side coil is connected to an output terminal of the second amplification device,
wherein another end of the output-side coil is connected to ground,
wherein the phase shift line is connected between the output terminal of the first amplification device and the end of the input-side coil or between the output terminal of the second amplification device and the other end of the input-side coil,
wherein the first circuit has a first inductor and a first capacitor that are connected in series to each other,
wherein the first inductor and the first capacitor are disposed in series on a path connecting the ground and a point on a path connecting an output terminal of the first amplification device and an end of the input-side coil,
wherein the second circuit has a second inductor, a second capacitor, and a third inductor, the second inductor and the second capacitor being connected in series to each other, the third inductor being connected in parallel to the second capacitor, and
wherein the second inductor and the second capacitor are disposed in series on a path connecting the ground and a point on a path connecting the output terminal of the second amplification device and the other end of the input-side coil.

2. A communication device comprising:
a signal processing circuit that processes a radio frequency signal; and
the radio frequency circuit according to claim 1 that transmits a radio frequency signal between the signal processing circuit and an antenna.

3. The radio frequency circuit according to claim 1,
wherein the first amplification device is a carrier amplifier, and
wherein the second amplification device is a peaking amplifier.

4. The radio frequency circuit according to claim 3, further comprising:
a first cutoff capacitor disposed in series on a path connecting the output terminal of the first amplification device and the first circuit; and
a second cutoff capacitor disposed in series on a path connecting the output terminal of the second amplification device and the second circuit.

5. The radio frequency circuit according to claim 4, further comprising:
a substrate,
wherein the second inductor and the third inductor are each a surface mount device disposed on a surface of the substrate, and
wherein a magnetic flux direction of the second inductor is orthogonal to a magnetic flux direction of the third inductor.

6. The radio frequency circuit according to claim 4, further comprising:
a substrate,
wherein the second inductor is formed from a conductor coil formed inside the substrate,
wherein the third inductor is a surface mount device disposed on a surface of the substrate, and
wherein a magnetic flux direction of the second inductor is orthogonal to a magnetic flux direction of the third inductor.

7. A radio frequency circuit comprising:
a first amplification device and a second amplification device;
a first transformer having a first input-side coil and a first output-side coil;
a second transformer having a second input-side coil and a second output-side coil;
a signal output terminal to which an end of the first output-side coil is connected;
a first circuit and a second circuit; and
a phase shift line,
wherein an end of the first input-side coil is connected to an output terminal of the first amplification device, another end of the first input-side coil is connected to ground, an end of the second input-side coil is connected to an output terminal of the second amplification device, and another end of the second input-side coil is connected to the ground,
wherein another end of the first output-side coil is connected to an end of the second output-side coil, and another end of the second output-side coil is connected to the ground,
wherein the phase shift line is connected between the output terminal of the first amplification device and the end of the first input-side coil or between the output terminal of the second amplification device and the end of the second input-side coil,
wherein the first circuit has a first inductor and a first capacitor that are connected in series to each other, wherein the first inductor and the first capacitor are disposed in series on a path connecting the ground and a point on a path connecting the output terminal of the first amplification device and the end of the first input-side coil, wherein the second circuit has a second inductor, a second capacitor, and a third inductor, the second inductor and the second capacitor being connected in series to each other, the third inductor being connected in parallel to the second capacitor, and wherein the second inductor and the second capacitor are disposed in series on a path connecting the ground and a point on a path connecting the output terminal of the second amplification device and the end of the second input-side coil.

8. The radio frequency circuit according to claim 7, wherein the first amplification device is a carrier amplifier, and wherein the second amplification device is a peaking amplifier.

9. The radio frequency circuit according to claim 8, further comprising:

a first cutoff capacitor disposed in series on a path connecting the output terminal of the first amplification device and the first circuit; and a second cutoff capacitor disposed in series on a path connecting the output terminal of the second amplification device and the second circuit.

10. The radio frequency circuit according to claim 9, further comprising:

a substrate, wherein the second inductor and the third inductor are each a surface mount device disposed on a surface of the substrate, and wherein a magnetic flux direction of the second inductor is orthogonal to a magnetic flux direction of the third inductor.

11. The radio frequency circuit according to claim 9, further comprising:

a substrate, wherein the second inductor is formed from a conductor coil formed inside the substrate, wherein the third inductor is a surface mount device disposed on a surface of the substrate, and wherein a magnetic flux direction of the second inductor is orthogonal to a magnetic flux direction of the third inductor.

12. A communication device comprising:

a signal processing circuit that processes a radio frequency signal; and the radio frequency circuit according to claim 7 that transmits a radio frequency signal between the signal processing circuit and an antenna.

13. A radio frequency circuit comprising:

a first amplification device, a second amplification device, a third amplification device, and a fourth amplification device;

a first transformer having a first input-side coil and a first output-side coil;

a second transformer having a second input-side coil and a second output-side coil;

a signal output terminal to which an end of the first output-side coil is connected;

a first circuit, a second circuit, a third circuit, and a fourth circuit; and a first phase shift line and a second phase shift line, wherein an end of the first input-side coil is connected to an output terminal of the first amplification device, another end of the first input-side coil is connected to an output terminal of the third amplification device, an end of the second input-side coil is connected to an output terminal of the second amplification device, and another end of the second input-side coil is connected to an output terminal of the fourth amplification device, wherein another end of the first output-side coil is connected to an end of the second output-side coil, and another end of the second output-side coil is connected to ground, wherein the first phase shift line is connected between the output terminal of the first amplification device and the end of the first input-side coil, and the second phase shift line is connected between the output terminal of the third amplification device and the other end of the first input-side coil, or the first phase shift line is connected between the output terminal of the second amplification device and the end of the second input-side coil, and the second phase shift line is connected between the output terminal of the fourth amplification device and the other end of the second input-side coil, wherein the first circuit has a first inductor and a first capacitor that are connected in series to each other, wherein the first inductor and the first capacitor are disposed in series on a path connecting the ground and a point on a path connecting the output terminal of the first amplification device and the end of the first input-side coil, wherein the second circuit has a second inductor, a second capacitor, and a third inductor, the second inductor and the second capacitor being connected in series to each other, the third inductor being connected in parallel to the second capacitor, wherein the second inductor and the second capacitor are disposed in series on a path connecting the ground and a point on a path connecting the output terminal of the second amplification device and the end of the second input-side coil, wherein the third circuit has a fourth inductor and a third capacitor that are connected in series to each other, wherein the fourth inductor and the third capacitor are disposed in series on a path connecting the ground and a point on a path connecting the output terminal of the third amplification device and the other end of the first input-side coil, wherein the fourth circuit has a fifth inductor, a fourth capacitor, and a sixth inductor, the fifth inductor and the fourth capacitor being connected in series to each other, the sixth inductor being connected in parallel to the fourth capacitor, and wherein the fifth inductor and the fourth capacitor are disposed in series on a path connecting the ground and a point on a path connecting the output terminal of the fourth amplification device and the other end of the second input-side coil.

14. The radio frequency circuit according to claim 13, wherein the first amplification device and the third amplification device are each a carrier amplifier, and wherein the second amplification device and the fourth amplification device are each a peaking amplifier.

15. The radio frequency circuit according to claim 14, wherein the first amplification device and the third amplification device form a pair of differential amplifiers, and wherein the second amplification device and the fourth amplification device form a pair of differential amplifiers.

16. The radio frequency circuit according to claim 15, further comprising:

a first cutoff capacitor disposed in series on a path connecting the output terminal of the first amplification device and the first circuit;

a second cutoff capacitor disposed in series on a path connecting the output terminal of the second amplification device and the second circuit;

a third cutoff capacitor disposed in series on a path connecting the output terminal of the third amplification device and the third circuit; and a fourth cutoff capacitor disposed in series on a path connecting the output terminal of the fourth amplification device and the fourth circuit.

17. The radio frequency circuit according to claim 16, further comprising:

a substrate, wherein the second inductor, the third inductor, the fifth inductor, and the sixth inductor are each a surface mount device disposed on a surface of the substrate, wherein a magnetic flux direction of the second inductor is orthogonal to a magnetic flux direction of the third inductor, and wherein a magnetic flux direction of the fifth inductor is orthogonal to a magnetic flux direction of the sixth inductor.

18. The radio frequency circuit according to claim 16, further comprising:

a substrate, wherein the second inductor and the fifth inductor are formed from a conductor coil formed inside the substrate, wherein the third inductor and the sixth inductor are each a surface mount device disposed on a surface of the substrate, wherein a magnetic flux direction of the second inductor is orthogonal to a magnetic flux direction of the third inductor, and wherein a magnetic flux direction of the fifth inductor is orthogonal to a magnetic flux direction of the sixth inductor.

19. A communication device comprising:

a signal processing circuit that processes a radio frequency signal; and the radio frequency circuit according to claim 18 that transmits a radio frequency signal between the signal processing circuit and an antenna.

20. A communication device comprising:

a signal processing circuit that processes a radio frequency signal; and the radio frequency circuit according to claim 13 that transmits a radio frequency signal between the signal processing circuit and an antenna.

* * * * *